(12) United States Patent
Okubo et al.

(10) Patent No.: US 9,666,818 B2
(45) Date of Patent: May 30, 2017

(54) TANDEM-TYPE ORGANIC PHOTOELECTRIC CONVERSION ELEMENT AND SOLAR BATTERY

(75) Inventors: Yasushi Okubo, Tokyo (JP); Noriko Yasukawa, Tokyo (JP); Hiroaki Itoh, Tokyo (JP); Takamune Hattori, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 1206 days.

(21) Appl. No.: 13/395,517

(22) PCT Filed: Sep. 8, 2010

(86) PCT No.: PCT/JP2010/065389
§ 371 (c)(1),
(2), (4) Date: Mar. 12, 2012

(87) PCT Pub. No.: WO2011/033974
PCT Pub. Date: Mar. 24, 2011

(65) Prior Publication Data
US 2012/0199186 A1    Aug. 9, 2012

(30) Foreign Application Priority Data
Sep. 18, 2009   (JP) ................ 2009-216350

(51) Int. Cl.
*H01L 51/00* (2006.01)
*H01L 51/42* (2006.01)
(Continued)

(52) U.S. Cl.
CPC .......... *H01L 51/4253* (2013.01); *B82Y 10/00* (2013.01); *H01L 27/302* (2013.01);
(Continued)

(58) Field of Classification Search
CPC .... H01L 31/0684; H01L 51/42–51/448; H01L 31/0687; H01L 31/0725; H01L 31/076
See application file for complete search history.

(56) References Cited

U.S. PATENT DOCUMENTS

2005/0249970 A1* 11/2005 Suzuri et al. ................ 428/690
2008/0116536 A1*  5/2008 Forrest et al. ............... 257/431
2009/0126779 A1*  5/2009 Heeger et al. ............... 136/249

FOREIGN PATENT DOCUMENTS

JP  2007269794 A  * 10/2007
WO  2008/060716     5/2008
(Continued)

OTHER PUBLICATIONS

Tanaka et al. Monolithic parallel tandem organic photovoltaic cell with transparent carbon nanotube interlayer. Applied Physics Letters vol. 94, article 113506 (2009).*
(Continued)

*Primary Examiner* — Eric R Smith
(74) *Attorney, Agent, or Firm* — Lucas & Mercanti, LLP

(57) ABSTRACT

A tandem-type organic photoelectric conversion element has at least a first electrode, a second electrode, and a plurality of bulk heterojunction layers each comprising a p-type organic semiconductor material and an n-type organic semiconductor material. The tandem-type organic photoelectric conversion element and a solar battery are characterized in that when the absorption wavelengths of the bulk heterojunction layers are such that a second bulk heterojunction layer absorbs up to a longer wavelength than a first bulk heterojunction layer, the LUMO energy level (LUMO(n1)) of the film of the n-type semiconductor in the first bulk heterojunction layer and the LUMO energy level (LUMO(n2)) of the film of the n-type semiconductor in the second bulk heterojunction layer satisfy the following equation (1):

$$0.4 \text{ eV} \geq \text{LUMO}(n1) - \text{LUMO}(n2) \geq 0.1 \text{ eV} \quad (1).$$

14 Claims, 1 Drawing Sheet

(51) Int. Cl.
*H01L 27/30* (2006.01)
*B82Y 10/00* (2011.01)

(52) U.S. Cl.
CPC ...... *H01L 51/0036* (2013.01); *H01L 51/0039* (2013.01); *H01L 51/0043* (2013.01); *H01L 51/0047* (2013.01); *H01L 2251/552* (2013.01); *Y02E 10/549* (2013.01)

(56) References Cited

FOREIGN PATENT DOCUMENTS

| WO | 2008060716 A2 | 5/2008 |
|---|---|---|
| WO | 2008/066933 | 6/2008 |

OTHER PUBLICATIONS

Lenes et al. Fullerene Bisadducts for Enhanced Open-Circuit Voltages and Efficiencies in Polymer Solar Cells. Advanced Materials 2008, vol. 20, pp. 2116-2119.*
Fernandez-Paniagua et al. Thermal and Microwave-Assisted Synthesis of Diels-Alder Adducts of [60]Fullerene with 2,3-Pyrazinoquinodimethanes: Characterization and Electrochemical Properties. Journal of Organic CHemistry 1997, vol. 62, pp. 3705-3710.*
Sukeguchi et al. New diarylmethanofullerene derivatives and their properties for organic thin-film solar cells. Beilstein Journal of Organic Chemistry 2009, vol. 5, No. 7, 10 pages total.*
Peet et al. Efficiency enhancement in low-bandgap polymer solar cells by processing with alkane dithiols. Nature Material 2007, vol. 6, pp. 497-500.*
English machine translation of JP 2007-269794.*
Fernandez et al. (Thermal and Microwave-Assisted Synthesis of Diels-Alder Adducts of [60]Fullerene with 2,3-Pyrazinoquinodimethanes: Characterization and Electrochemical Properties. Journal of Organic Chemistry 1997, vol. 62, pp. 3705-3710).*

Kim et al. (Efficient Tandem Polymer Solar Cells Fabricated by All-Solution Processing). Science 2007, vol. 317, p. 222-225).*
A. Hadipour, B. de Boer, and P. W. M. Blom, "Organic tandem and multi-junction solar cells", Advanced Functional Materials (18) p. 169-181 (2008).*
B. Minnaert and M. Burgelman, "Efficiency potential of organic bulk heterojunction solar cells", Progress in Photovoltaics: Research and Applications (15), p. 741-748 (2007).*
M. M. Wienk et al., "Low-band gap poly(di-2-thienylthienopyrazine):fullerene solar cells", Applied Physics Letters 88, 153511 (2006).*
Jin Young Kim et al., "Efficient Tandem Polymer Solar Cells Fabricated by All-Solution Processing", Science, vol. 317 No. 5835 (Jul. 13, 2007), pp. 222-225.
Masahiro Hiramoto et al., "Effect of Thin Gold Interstitial-layer on the Photovoltaic Properties of Tandem Organic Solar Cell", Chemistry Letters, vol. 19 (1990), No. 3, pp. 327-330.
Jan Gilot et al., "Double and triple junction polymer solar cells processed from solution", Applied Physics Letters, vol. 90, No. 14 (2007), 143512 (3 pages).
Xiangjun Wang et al., "Infrared photocurrent spectral response from plastic solar cell with low-band-gap polyfluorene and fullerene derivative", Applied Physics Letters, vol. 85, No. 21 (2004), pp. 5081-5083.
J. Peet et al., "Efficiency enhancement in low-bandgap polymer solar cells by processing with alkane dithiols", Nature Materials, vol. 6, No. 7 (2007), pp. 497-500.
Office Action dated Jun. 25, 2013 from Japanese priority application JP 2011-531896 and English translation.
Office Action dated Nov. 19, 2013 from Japanese priority application JP 2011-531896 and English translation.
Office Action dated Nov. 25, 2014 from Japanese application JP 2014-028146 and English translation.
Office Action dated Jun. 2, 2015 from Japanese application JP 2014-028146 and English translation.
Jun Sakai, et al; Efficient organic photovoltaic tandem cells with poly (3-hexylthiophene) . . . ; B20265JP03; 4 pages.

* cited by examiner

TANDEM-TYPE ORGANIC PHOTOELECTRIC CONVERSION ELEMENT AND SOLAR BATTERY

CROSS REFERENCE TO RELATED APPLICATION

This Application is a 371 of PCT/JP2010/065389 filed on Sep. 8, 2010 which, in turn, claimed the priority of Japanese Patent Application No. 2009-216350 filed on Sep. 18, 2009, both applications are incorporated by reference herein.

TECHNICAL FIELD

This invention relates to a tandem-type organic photoelectric conversion element and a solar cell, and in particular, to a tandem-type organic photoelectric conversion element of a bulk hetero junction type and a solar cell using this tandem-type organic photoelectric conversion element.

BACKGROUND

Due to the jump of fossil energy price in recent years, it is required the system which can generate electric power directly from natural energy. To respond such requirement, it have been proposed or put to practical use a solar cell using Si in a single crystal, a polycrystalline, or an amorphous state, a solar cell made of a compound of GaAs or CIGS, or a dye sensitized photoelectric conversion element (Gratzel cell).

However, the cost of electric power generation with these solar cells is still higher than the price of electricity generated and transmitted using the fossil fuel, and it has been an obstacle for the spread of solar cells.
Moreover, it is needed to use a heavy glass as a substrate, and reinforcement work is required at the time of installation. This is also a cause which increases the cost of electric power generation.

Under such circumstance, it was proposed a bulk hetero junction type photoelectric conversion element as a solar cell which can achieve lower electric generating cost than the electric generating cost using a fossil fuel. In this photoelectric conversion element, there is a bulk hetero junction layer mixed with an election donor layer (p-type semiconductor layer) and an electron acceptor layer (n-type semiconductor layer) sandwiched between an anode and cathode (for example, refer to Non-patent document 1 and Patent document 1).

In these bulk hetero junction type solar cells, the composing members are formed with a coating process except an anode and a cathode. Therefore, it is expected that high-speed and low cost production is possible, and the problems of the above-mentioned electric power generation cost may be resolved. Furthermore, unlike the above-mentioned Si system solar cell, compound semiconductor system solar cell, and dye-sensitized solar cell, there is no high temperature process above 160° C. Therefore, it is expected that formation of a cell on a low cost and lightweight plastic substrate is also possible.

In addition, the electric power generating cost must be calculated by including generation efficiency and durability of an element besides an initial manufacturing cost. In the above-mentioned non-patent document 1, in order to absorb a natural sunlight spectrum efficiently, it has come to attain the conversion efficiency exceeding 5% by using an organic polymer which can absorb to about 900 nm.

However, in order to obtain a further improved efficiency, utilization of natural sunlight with broader spectra is requested. In order to use natural sunlight with broader spectra, it is requested to expand the wavelength band which can be used or raising the absorbance of specific wave length.

As a technology to achieve both improvement of the absorbing efficiency of light and expanding the wavelength band, the tandem technology has been paid attention. This is a technology which laminates two or more solar cells. If the solar cells to be laminated are the same, increase of the light absorption efficiency will be anticipated, and if the solar cells which absorb different wave length are laminated, expansion of the wavelength band which can be used will be anticipated.

As an example of such technology, a solar cell system is disclosed in which one solar cell is connected to another solar cell having the completely same composition composed of phthalocyanine and N,N-dimethylperylene tetracarboxylic diimide with very thin gold (for example, refer to Non-patent document 2). As a result, although improvement in open circuit voltage is obtained, the photoelectric conversion efficiency itself is falling from the fall-off of the short-circuit current accompanying a layer upon layer. The solar cell located at the inner part from the incidence side of a light will surely receive a decreased amount of light and the amount of generated electric current will be decreased. Furthermore, with a tandem element, since an electric current value is restricted to lowest electric current value in the solar cell system by which the stack was carried out, it is presumed that improvement in efficiency was not obtained. From such a viewpoint, it is thought preferable that the solar cells to be laminated each absorb a different spectrum with each other. Moreover, since vacuum evaporation is employed to produce an element, manufacturing efficiency is low.

There is disclosed a tandem-type solar cell which has a first layer containing polyphenylene vinylene (PPV) and phenyl-C61-butyric acid methyl ester (PCBM), and a second layer containing poly(3-hexylthiophene) (P3HT) and PCBM (for example, refer to Non-patent document 3). Absorption of PPV and P3HT each is around 600 nm, and since they absorb almost the same natural sunlight spectrum, efficiency has not been improved by making a tandem-type composition compared with single composition.

Further, there is disclosed a tandem-type solar cell which has a first layer containing poly[2,6-(4,4-bis(2-ethylhexyl)-4H-cyclopentadithiophen)-4,7-(2,1,3-benzthiadiazole)] (PCPDTBT) and PC60BM, and a second layer containing P3HT and PC70BM (for example, refer to Non-patent document 4 and Patent document 2). The composed element having a higher efficiency than an efficiency of a single cell can be obtained at last here. It has been succeeded in obtaining a photoelectric conversion element having a high efficiency of 6.5% by designing the portions of an absorption spectrum so that the 1st layer mainly absorbs lights of 600 to 900 nm and the 2nd layer mainly absorbs lights of 400 to 600 nm.

However, neither of the disclosed tandem-type organic photoelectric conversion elements (for example, refer to Non-patent documents 3 to 5) reaches completely the efficiency of the sum of the efficiency of single composition, and the ideal tandem element is not yet obtained.

As a possible reason of this, it is presumed as follows. When a tandem composition is achieved, although an open circuit voltage (Voc) is obtained as a sum of each single element, decrease of a short-circuit current (Jsc) and a fill factor (FF) is observed, namely, the resistance as the whole element is increased.

Moreover, when putting an organic thin film type solar cell in practical use, not only efficiency but cost and durability become three important components. Regarding the durability, it was disclosed that the relative efficiency fall-off with respect to the initial efficiency was as large as about 40% after 100 hours use under the optical exposure of AM1.5G. This indicates that there is still problem of durability.

The present inventors assumed the reason of such an efficiency fall-off as follows. As a result by which the production of electricity from two bulk hetero junction layers is not coincided thoroughly, as opposed to the requirement that a hole which comes from one bulk hetero junction layer and an electron which comes from another bulk hetero junction layer should be recombined mutually to result in becoming a neutral electric charge, it was presumed that the electric current (electrons) from the 1st bulk hetero junction layer that mainly absorbs a short wave region becomes overabundant, and the electrons which cannot be recombined form reverse jointing at the interface with the 2nd bulk hetero junction layer, to result in forming resistance. Moreover, it was assumed that this will be concerned not only with a mere efficiency fall-off but with deterioration of an organic photoelectric conversion element.

PRIOR ART DOCUMENTS

Patent Documents

Patent document 1: WO 2008-066933
Patent document 2: WO 2008-060716

Non-Patent Documents

Non-patent document 1: A. Heeger, Nature Mat. vol. 6 (2007), p 497
Non-patent document 2: Chem. Let. vol. 19 (1990), p 327 (Osaka University, Hiramoto)
Non-patent document 3: Appl. Phys. Lett. 2007, 90, 143512 (Eindhoven University)
Non-patent document 4: Science, vol. 317 (2007), p 222 (Heeger)
Non-patent document 5: Appl. Phys. Lett. 2006, 89, 73502 (Linz Univ., Sacrifiti)

SUMMARY OF THE INVENTION

Problems to be Solved by the Invention

The present Inventors found out the followings. When the electron which begins to leak from the 1st bulk hetero junction layer superfluously and reaches the 2nd bulk hetero junction layer, if there are used an n-type semiconductor material in the 2nd bulk hetero junction layer having deeper LUMO level than an n-type semiconductor material in the 1st bulk hetero junction layer, it becomes easy to pour the electron into the LUMO of the n-type semiconductor material in the 2nd bulk hetero junction layer. The charge up of the electric charge in such a reverse joining interface was canceled, and it was found out that efficiency and lifetime of the element could be improved.

In addition, in PC60BM and PC70BM, which were used in the above-mentioned Non-patent document 4 and Patent document 2, each LUMO level is substantially the same value. Moreover, the element described in the above-mentioned Non-patent document 5 was produced by laminating: a 1st layer containing P3HT and PCBM as a photoelectric conversion layer; and a 2nd layer containing zinc phthalocyanine and C60 fullerene. When the 2nd photoelectric conversion layer was laminated, it was selected a vacuum deposition as a means which can perform film production easily without giving a damage to the 1st photoelectric conversion layer, as a result, selection of C60 was done only because it is a fullerene which can be vacuum deposited. It cannot be found a concept of choosing the LUMO level of the n-type semiconductor material in the 2nd layer for the purpose of improving efficiency and durability. In effect, both PCBM of the 1st layer and C60 of the 2nd layer have almost an equivalent LUMO level. And in reality, FF and photoelectric conversion efficiency of an element fall as compared with a single element, and there was not described about its durability. Furthermore, since the 2nd bulk hetero junction layer was produced by the vapor deposition process having low manufacturing efficiency, it was difficult to provide a low cost solar cell using this element.

The present invention was made in view of the above-mentioned problems to be solved. An object of the present invention is to provide a tandem-type organic photoelectric conversion element which has a high photoelectric conversion efficiency and high durability, and also to provide a solar cell containing the same photoelectric conversion element.

Means to Solved the Problems

The above-mentioned object of the present invention can be achieved by the following compositions.

1. A tandem-type organic photoelectric conversion element comprising at least a first electrode, a second electrode and a plurality of bulk hetero junction layers each containing an n-type semiconductor material and a p-type semiconductor material, wherein, when a second bulk hetero junction layer absorbs a light of longer wavelength than a first hulk hetero junction layer with respect to wavelength of an absorbed light of the aforesaid bulk hetero junction layers, a LUMO level in a film state of the n-type semiconductor material of the first bulk hetero junction layer (LUMO(n1)) and a LUMO level in a film state of the n-type semiconductor material of the second bulk hetero junction layer (LUMO(n2)) satisfy the following Expression (1).

$$0.4 \text{ eV} \geq \text{LUMO}(n1) - \text{LUMO}(n2) \geq 0.1 \text{ eV} \qquad \text{Expression (1)}$$

2. The tandem-type organic photoelectric conversion element described in the aforesaid item 1, wherein all of the plurality of bulk hetero junction layers are formed with a coating method.

3. The tandem-type organic photoelectric conversion element described in the aforesaid items 1 or 2, wherein the LUMO level in a film state of the n-type semiconductor material of the second bulk hetero junction layer (LUMO(n2)) satisfies the following expression (2).

$$-4.4 \text{ eV} \geq \text{LUMO}(n2) \geq -4.6 \text{ eV} \qquad \text{Expression (2)}$$

4. The tandem-type organic photoelectric conversion element described in any one of the aforesaid items 1 to 3, wherein the LUMO level in a film state of the n-type semiconductor material of the first bulk hetero junction layer (LUMO(n1)) satisfies the following expression (3).

$$-4.0 \text{ eV} \geq \text{LUMO}(n1) \geq -4.2 \text{ eV} \qquad \text{Expression (3)}$$

5. The tandem-type organic photoelectric conversion element described in any one of the aforesaid items 1 to 4,
wherein the LUMO level in a film state of the n-type semiconductor material of the first bulk hetero junction layer (LUMO(n1)) and the LUMO level in a film state of the n-type semiconductor material of the second bulk hetero junction layer (LUMO(n2)) satisfy the following Expression (4).

$0.3 \text{ eV} \geq \text{LUMO}(n1) - \text{LUMO}(n2) \geq 0.2 \text{ eV}$  Expression (4)

6. The tandem-type organic photoelectric conversion element described in the aforesaid item 2,
wherein the n-type semiconductor material of the second bulk hetero junction layer is a compound represented by the following Formula (1).

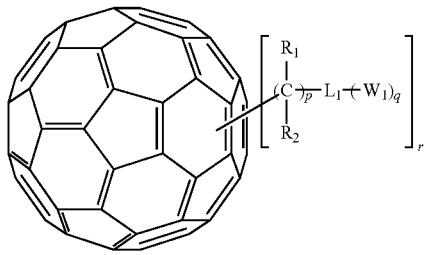

In the above Formula, $W_1$ represents an electron withdrawing group; and $L_1$ represents a single bond or a divalent linking group of a conjugated system selected from the group consisting of an alkenylene group, an alkynylene group, an arylene group and a hetero arylene group. $R_1$ and $R_2$ each represent a monovalent substituent, provided that $R_1$ or $R_2$ may be bonded to fullerene with a single bond. p represents an integer of 0 or 1. q and r each represent an integer of 1 to 5.

7. The tandem-type organic photoelectric conversion element described in the aforesaid item 6,
wherein $W_1$ in Formula (1) represents a fluoroalkyl group.

8. The tandem-type organic photoelectric conversion element described in the aforesaid item 6,
wherein the compound represented by the aforesaid Formula (1) is further represented by the following Formula (2).

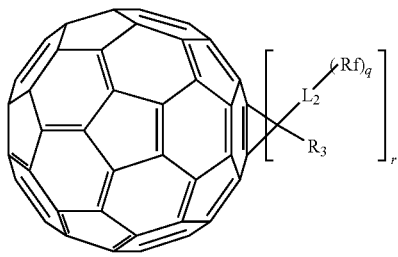

In the above Formula, Rf represents a fluoroalkyl group of 1 to 20 carbon atoms or a fluoroaryl group; $L_2$ represents a single bond or a divalent linking group of a conjugated system selected from the group consisting of an alkenylene group, an alkynylene group, an arylene group and a hetero arylene group. $R_3$ represents a monovalent substituent. q and r each represent an integer of 1 to 5.

9. The tandem-type organic photoelectric conversion element described in any one of the aforesaid items 6 to 8,
wherein $L_1$ in Formula (1) and $L_2$ in Formula (2) each represent a nitrogen containing hetero aryl group.

10. The tandem-type organic photoelectric conversion element described in any one of the aforesaid items 1 to 9,
wherein the p-type semiconductor material contained in the second bulk hetero junction layer has a band gap of 1.5 to 1.0 eV.

11. The tandem-type organic photoelectric conversion element described in any one of the aforesaid items 1 to 10,
wherein the p-type semiconductor material is a compound having a partial structure represented by the following Formula (3).

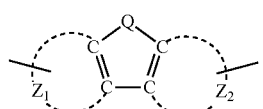

In the above Formula, Q represents one selected from the group consisting of a substituted or unsubstituted carbon, nitrogen, oxygen, silicon, phosphor, sulfur and germanium atom. $Z_1$ represents a substituted or unsubstituted 6-membered nitrogen containing aromatic heterocycle; and $Z_2$ represents a substituted or unsubstituted 6-membered aromatic hydrocarbon group or a substituted or unsubstituted 6-membered aromatic heterocycle.

12. The tandem-type organic photoelectric conversion element described in the aforesaid item 11,
wherein Q in Formula (3) which represents the partial structure of the compound is a substituted or unsubstituted nitrogen atom.

13. The tandem-type organic photoelectric conversion element described in the aforesaid items 11 or 12,
wherein the p-type semiconductor material is a compound having a partial structure represented by the following Formula (4).

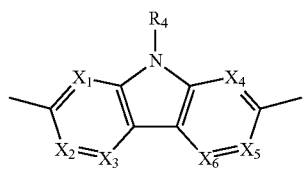

In the above Formula, $X_1$ to $X_6$ each represent a substituted or unsubstituted carbon or nitrogen atom, provided that at lease one of $X_1$ to $X_6$ represents a nitrogen atom. $R_4$ represents a hydrogen atom, a halogen atom or a substituent selected from the group consisting of a substituted or unsubstituted alkyl, cycloalkyl, aryl and hetero aryl group.

14. The tandem-type organic photoelectric conversion element described in the aforesaid item 13,
wherein $X_2$ and $X_5$ in Formula (5) which represents the partial structure of the compound is a nitrogen atom.

15. A solar cell comprising the tandem-type organic photoelectric conversion element described in any one of the aforesaid items 1 to 14.

Effects of the Invention

The present invention made it possible to provide an organic photoelectric conversion element exhibiting high photoelectric conversion efficiency and high durability, and also to provide a solar cell having this organic photoelectric conversion element.

EMBODIMENTS TO CARRY OUT THE INVENTION

Figure 1:
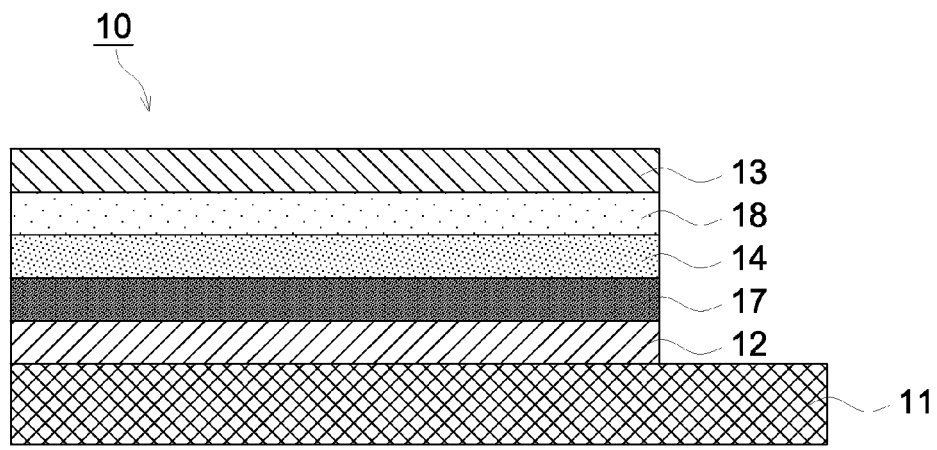
FIG. 1 is a cross-sectional view showing a solar cell composed of an organic photoelectric conversion element of a bulk hetero junction type.

Hereafter, the best embodiments to carry out the present invention will be described in details, however, the present invention is not limited to them.

The present inventors found out the way which will solve the problems of the present invention by maintaining the difference of LUMO levels of the n-type semiconductor materials in a film state (hereinafter, it also called as the LUMO levels of n-type semiconductor materials) for the 1st layer and the 2nd layer in a tandem-type element of the organic thin film solar cell to be in a predetermined relationship.

That is, it was found out that an organic thin film solar cell provided with high efficiency, high durability and low cost can be produced by setting up so that the LUMO level of the n-type semiconductor materials included in the 1st and 2nd photoelectric conversion layers may become in the range of 0.1 eV to 0.5 eV.

The problem occurred when the system is made in a tandem state will be described in more detail. The key to solve the problem is how to send an electric current without stagnating of this electric charge when the difference of an electric current occurred among two or more bulk hetero junction layers. It was presumed that this stagnating of the electric charge will occur mainly due to the stagnation of electrons at an interface between the hole transport layer and the electricity generating layer of the cell for the longer wavelength.

As a solution to solve such problem, it was found as follows: the LUMO level in a film state of the n-type semiconductor layer of the bulk hetero junction layer which absorbs the longer wavelength side was made deep. By this, it was found out that a certain amount of electrons resided in a hole transport layer could be poured in a counter electrode via the LUMO level of the n-type semiconductor of a bulk hetero junction layer, and the above-mentioned problem could be resolved.

More preferably, the difference of LUMO levels of the n-type semiconductor material contained in the 1st and 2nd photoelectric conversion layers is in the range of 0.2 eV to 0.4 eV.

Further preferably, the LUMO level of the n-type semiconductor material of the 2nd layer is in the range of −4.4 eV to −4.6 eV. PEDOT:PSS is employed as a widely used positive hole transporting layer. Since this material is a doped conductive material and a positive hole and an electron can be passed, when there is more produced amount of electricity from the 1st bulk hetero junction layer than the produced amount of electricity from the 2nd bulk hetero junction layer, the electricity begins to leak from the recombination layer and it reaches to the hole transporting layer (PEDOT:PSS) of the 2nd layer. In PCBM which is a common n-type semiconductor material, the difference of the level between the n-type semiconductor material contained in the 2nd bulk hetero junction layer and the hole transporting layer is about 0.7 eV, and it is difficult for the electrons to be poured from the PEDOT:PSS layer into LUMO of PCBM. However, when this LUMO level is made into the above-mentioned range, electron injection becomes possible to a small extent from the PEDOT:PSS layer, stagnation of the electric charge between layers is improved, and photoelectric conversion efficiency and durability of the element can be improved. On the other hand, when the LUMO level of n-type materials is made too deep, since the open circuit voltage and photoelectric conversion efficiency from the 2nd bulk hetero junction layer will be decreases, it is not desirable.

The LUMO level is more preferably in the range of −4.5 to −4.6 eV.

On the other hand, as for the LUMO level of the n-type semiconductor material in the 1st layer, in order to prevent the above-mentioned stagnated electrons from back running to the 1st bulk hetero junction layer, conversely, it is preferable that the LUMO level of the 1st layer is higher than the LUMO level of the n-type semiconductor material of the 2nd layer. It is more preferable that the LUMO level of the n-type semiconductor material of the 1st layer is in the range of −4.0 to −4.2 eV. By making such composition, the reverse electron flow from the intermediate electrode can be prevented, the fill factor can be improved, and the photoelectric conversion efficiency and the durability can also be improved. In addition, with an n-type semiconductor material shallower than −4.0 eV, since the n-type semiconductor material may have a tendency of becoming unstable, it is not desirable.

In the present invention, it is necessary to compare the LUMO level of a bulk hetero junction layer as a value in a thin film state (in a solid state).

It is known that a spectrum of an organic substance has a different absorption edge which changes by intermolecular interactions in the solution state and in the thin film state (in a solid state). That is, the same material shows band gaps which differ in the solution state and in the thin film state. As a result, HOMO and LUMO in a membrane state show different values from the values obtained with a cyclic voltammetry (CV) measured in a solution, and it is needed to determine these levels by the method to measure in the state of membrane.

Generally, as the approach of measuring LUMO in the state of a thin film, there are the following two approaches.

One is the way of measuring a LUMO level indirectly, and it is the approach of measuring the HOMO level and the band gap in a thin film state, and determining a LUMO level from the difference thereof. For example, when the HOMO level of a thin film state is obtained as −5.3 eV and the band gap is obtained as of 1.5 eV, the LUMO level in a thin film state is determined as −3.8 eV.

In addition, HOMO in a thin film state can be measured with an ultraviolet photoelectron spectroscopy (UPS) using a photoelectron spectroscopy apparatus JPS-9200 (made by JEOL Co., Ltd.) provided with a UPS light source. Moreover, the band gap in a thin film state can be measured with the absorption spectrum of the thin film formed in the shape of transparent substrate by using Spectrophotometer U-3300 (made by Hitachi High Technology Company).

Another is the way of measuring directly the LUMO level in a thin film state, and it is an approach called an Inverse Photoelectron Spectroscopy (IDES). It can be measured using PYS100 or 200 (made by Tech Science Co., Ltd.).

In the present invention, either is applicable. However, since work function of conductive materials, such as a metal, can also be measured by a photoelectron spectroscopy, the error resulting from using a plurality of apparatuses can be reduce by using an indirect determining method with a photoelectron spectroscopy. Therefore, measuring by the indirect approach is desirable.

In the following, first, the composition of an organic photoelectric conversion element, the layer composition of a tandem-type organic photoelectric conversion element which is prepared by laminating a plurality of organic photoelectric conversion elements, and effects thereof will be described.

(Compositions of Organic Photoelectric Conversion Element and Solar Cell)

FIG. 1 is a cross-sectional view showing a solar cell of a single composition (composed of a single bulk hetero junction layer) having an organic photoelectric conversion element of a bulk hetero junction type. In FIG. 1, organic photoelectric conversion element 10 of a bulk hetero junction type has a successively laminated structure on one surface of a substrate 11: an anode 12, a hole transport layer 17, a photoelectric conversion section 14 of a bulk hetero junction layer, an electron transport layer 18 and a cathode 13.

The substrate 11 is a member holding successively laminated members of the anode 12, the photoelectric conversion section 14 and the cathode 13. In this embodiment, since the incident light by which photoelectric conversion is carried out enters from the substrate 11 side, the substrate 11 is a member which enables to pass through this light by which photoelectric conversion is carried out, i.e., it is a transparent member to the wave length of this light that should be carried out photoelectric conversion. As for the substrate 11, a glass substrate and a resin substrate are used, for example. This substrate 11 is not indispensable. For example, the organic photoelectric conversion element 10 of a bulk hetero junction type may be formed by forming the anode 12 and the cathode 13 on both surfaces of photoelectric conversion section 14.

Photoelectric conversion section 14 is a layer which converts light energy into electric energy, and it is composed of a bulk hetero junction layer which is constituted by uniformly mixing a p-type semiconductor material and an n-type semiconductor material. A p-type semiconductor material functions relatively as an electron donor (donor), and an n-type semiconductor material functions relatively as an electron acceptor (acceptor). Here, an electron donor and an electron acceptor are "an electron donor and an electron acceptor which form a pair of electron and positive hole (charge separation state) by transfer of an electron from an electron donor to an electron acceptor when a light is absorbed." That is, an electron is not donated or received like an electrode, but an electron is donated or received by a photoreaction.

In FIG. 1, the incident light entering to the anode 12 through the substrate 11 is absorbed by an electron donor or an electron acceptor in the bulk hetero junction layer of the photoelectric conversion section 14. An electron is transferred from the electron donor to the electron acceptor to form a pair of electron and hole (charge separation state). The generated electric charge is transported by an internal electric field, (for example, the electric potential difference of the anode 12 and the cathode 13 when the work function of the anode 12 and the cathode 13 are different). An electron passes through electron acceptors, while a hole passes through electron donors, and the electron and the hole each are respectively transported to a different electrode, and a photocurrent is detected. For example, when the work function of the anode 12 is larger than the work function of the cathode 13, the electron is transported to the anode 12 and the hole is transported to the cathode 13. In addition, if the relative size of a work function is reversed, the electron and the positive hole will be transported to the reverse direction to that described above. Moreover, the transportation direction of an electron and a hole is also controllable by applying a potential between the anode 12 and the cathode 13.

In addition, although not described in FIG. 1, it may possible to have other layers, such as a hole block layer, an electron block layer, an electron injection layer, a hole injection layer, or a smoothing layer.

However, when only one bulk hetero junction layer is used for the photoelectric conversion element, the usable light spectral range is limited. In addition, since the carrier transport distance of an organic compound is shorter than that of an inorganic compound, the optimum layer thickness is limited to 100 to 300 nm. As a result, a part of the incident light will transmit or reflect at the cathode, and it was difficult to achieve improvement of photoelectric conversion efficiency.

Figure 2:
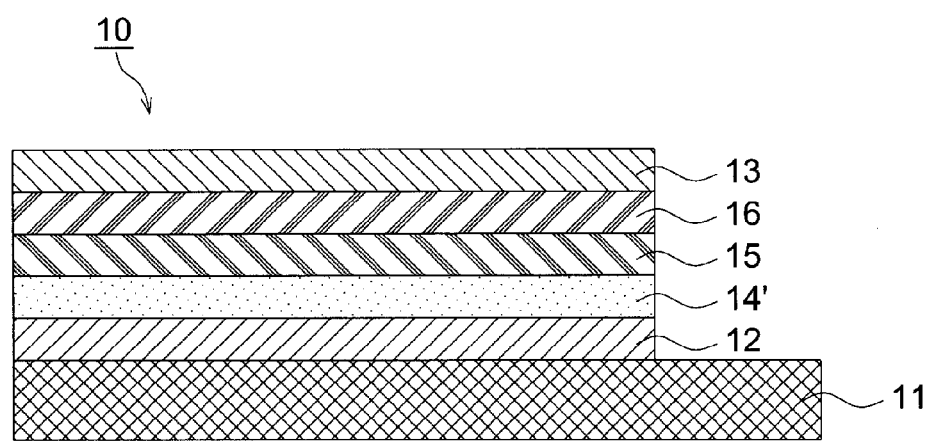
FIG. 2 is a cross-sectional view showing a solar cell composed of an organic photoelectric conversion element provided with bulk hetero junction layers of a tandem-type.

Therefore, in the present invention, it is preferable to make a tandem-type structure produced by laminating a plurality of the aforesaid photoelectric conversion elements for the purpose of improving a sunlight utilization factor (photoelectric conversion efficiency). FIG. 2 is a cross-sectional view showing a solar cell having an organic photoelectric conversion element containing bulk hetero junction layers of a tandem-type. A tandem-type structure can be made as follows. After laminating an anode 12 and a first photoelectric conversion section 14' successively on a substrate 11, a charge recombination layer 15 is laminated. Then, a second photoelectric conversion section 16 and a cathode 13 are laminated to achieve a tandem-type structure. The second photoelectric conversion section 16 may be a layer which absorbs the same spectrum as an absorption spectrum of the first photoelectric conversion section 14', or it may a layer which absorbs a different spectrum. In a tandem-type organic photoelectric conversion element, when an amount of electric current generated in each of a plurality of layers is different, the total amount of electric current is limited to the element having the smallest generating electric current. In order to equalize the amount of the generating electric current in each bulk hetero junction layer, it is preferable that the second photoelectric conversion section 16 absorbs a different spectrum from that of the first photoelectric conversion section 14'. Examples of a combination of a different spectrum are as follows: a combination of a 1st bulk hetero junction layer absorbing a sunlight till 1.9 eV, and a 2nd bulk hetero junction layer absorbing a sunlight till 1.3 eV; or a combination of a 1st bulk hetero junction layer absorbing a sunlight till 1.6 eV, and a 2nd bulk hetero junction layer absorbing a sunlight till 1.1 eV.

Hereinafter, the materials which enable to make these layers and these designs will be described.

[N-Type Semiconductor Material]

In the organic photoelectric conversion element of the present invention, it is characterized that LUMO levels used in a 1st bulk hetero junction layer and a 2nd bulk hetero junction layer are changed as described above. Therefore, an appropriate n-type semiconductor material for each bulk hetero junction layer is different.

[N-Type Semiconductor Material Used for Second Bulk Hetero Junction Layer]

A suitable material used for a 2nd bulk hetero junction layer (a bulk hetero junction layer which absorbs a longer wavelength region) is a material having a LUMO level in a film state of −4.4 eV to −4.6 eV as described above. Moreover, preferably it is an n-type semiconductor material which can effectively carry out electron transport with a p-type semiconductor material. Specifically, this material enables to achieve fast electron transport from a p-type semiconductor material and slow reverse electron transport to a p-type semiconductor material. It is preferable to use a fullerene derivative which substantially fulfills such properties.

Moreover, as mentioned above, from the viewpoint that an organic photoelectric conversion element is expected to be used as a low cost solar cell, it is desirable that it is the material which can be formed with a coating method, namely, it is required that the material has a high solubility. Preferably, the material dissolves in an organic solvent in an amount of 0.3 to 10 mass %, and more preferably, the material can dissolve in an organic solvent in an amount of 1.0 to 3.0 mass %.

Since the LUMO level of phenyl-C60-butyric acid methyl ester (PCBM), which is an n-type organic semiconductor material used typically now, is −4.3 eV, it is preferable to use the compound which has a LUMO level deeper than this (PCBM) as a compound which satisfies such characteristics.

Thus, it is preferable to use a compound having a fluoroalkyl group (Rf) as a substituent which gives high solubility and enables to achieve a deeper LUMO level than that of PCBM. That is, it is preferable to use a compound represented by the above-mentioned Formula (1).

In Formula (1), although fullerene C60, fullerene C70, fullerene C76, fullerene C78, fullerene C84, fullerene C240, and fullerene C540 are cited as a parent fullerene compound, it is preferable to use fullerene C60 or fullerene C70 from the viewpoint of synthetic easiness, and especially, fullerene C60 is preferable.

Examples of an electron withdrawing group represented by $W_1$ include: a halogen atom, an alkyl halide group, an aryl halide group, a halogenated hetero aryl group, a nitrogen containing hetero aryl group, a cyano group, a nitro group, a carbonyl group, a sulfonyl group, a phosphoryl group, and an alkynyl group.

As for W1, Although the above-mentioned required LUMO level can be obtained by combining suitable these substituents, when solubility is taken into consideration, it is desirable that $W_1$ is an alkyl halide group. Further preferably, $W_1$ is a fluoroalkyl group (Rf).

Examples of a fluoroalkyl group Rf include: a trifluoromethyl group, a pentafluoroethyl group, a heptafluoro-n-propyl group, a heptafluoroisopropyl group, a hexafluoroisopropyl group, a tetrafluoroisopropyl group, a nonafluoro n-butyl group, and a perfluoro-n-hexyl group.

As mentioned above, although all hydrogen atoms of an alkyl group need not to be substituted with fluorine atoms, and it may be substituted other than a fluorine atom, it is preferable that at least one or more fluorine atoms are substituted on the carbon atom combining with $L_1$ which is a linking group of a conjugated system. The LUMO level Ln of a fullerene compound can be made into a desired level and a desired solubility can be achieved by making such composition.

$L_1$ represents a single bond or a linking group selected from the group consisting of an arylene group, a hetero arylene group, an alkenylene group, and an alkyndiyl. By making a structure with introducing such linking group $L_1$ directly bonded to the fullerene parent portion (p=0), or bonded though one carbon atom (p=1), the electron withdrawing effect by $W_1$ group and Rf group will reach to the fullerene parent portion, and a prescribed LUMO level can be achieved. When p is 2 or more, since the electron withdrawing effect by $W_1$ group and Rf group will not reach to the fullerene parent portion, and a prescribed LUMO level may not be achieved, therefore it is not preferable.

Examples of a monovalent substituent represented by $R_1$ and $R_2$ include: a substituted or non-substituted alkyl group, cycloalkyl group, aryl group, hetero aryl group, and alkyl silyl group. $R_1$ and $R_2$ each may be a single bond to fullerene (or they may form a ring with fullerene). p presents an integer of 0 or 1, and q and r each presents an integer of 1 to 5.

As an alkyl group represented by $R_1$ and $R_2$, preferably, it is an alkyl group of 1 to 20 carbon atoms, and more preferably, it is an alkyl group of 1 to 12 carbon atoms, and still more preferably, it is an alkyl group of 1 to 8 carbon atoms. Examples thereof include: a methyl, ethyl, isopropyl, tert-butyl n-octyl, n-decyl, n-hexadecyl, and 2-ethylhexyl group.

As a cycloalkyl group, preferably, it is a cycloalkyl group of 4 to 8 carbon atoms. Examples thereof include: a cyclopropyl, cyclopentyl, cyclohexyl, norbornyl, and adamantyl group.

As an aryl group, preferably, it is an aryl group of 6 to 30 carbon atoms, more preferably, it is an aryl group of 6 to 20 carbon atoms, and still more preferably, it is an aryl group of 6 to 12 carbon atoms. Examples thereof include: a phenyl, p-methylphenyl, naphthyl, a phenanthryl, and pyrenyl group.

As a hetero aryl group, preferably, it is a hetero aryl group of 1 to 20 carbon atoms, more preferably, it is a hetero aryl group of 1 to 12 carbon atoms. As a hetero atom, it can be cited: a nitrogen atom, an oxygen atom, and a sulfur atom. Specific examples thereof include: an imidazolyl, pyridyl, quinolyl, furyl, piperidyl, benzoxazolyl, benzimidazolyl, benzthiazolyl, thienyl, furyl, pyrrole, and thiazolyl group.

As an alkylsilyl group, preferably, it is an alkylsilyl group of 3 to 15 carbon atoms. Examples thereof include: a trimethylsilyl, triethylsilyl, triisopropylsilyl, tricyclopentyl, and tris(trimethylsilyl)silyl group.

More preferably, it is a compound represented by Formula (2).

In Formula (2), Rf represents a fluoroalkyl group of 1 to 20 carbon atoms or a fluoroaryl group, $L_2$ represents a single bond or a divalent linking group of a conjugated system selected from the group consisting of an alkenylene group, an alkynylene group, an arylene group and a hetero arylene group. $R_3$ represents a monovalent substituent. q and r each represent an integer of 1 to 5.

A monovalent substituent represented by $R_3$ is preferably, just like the aforesaid R1 and R2, a substituted or non-substituted alkyl group, cycloalkyl group, aryl group, hetero aryl group, or alkyl silyl group.

By making a compound having such structure, it is possible to obtain a fullerene derivative which fulfills the above-mentioned solubility.

More preferably, a divalent linking group $L_2$ is a hetero arylene group. When $L_2$ is a hetero arylene group, it is possible to obtain a fullerene derivative which fulfills the required LUMO level and the above-mentioned solubility. Examples of a hetero arylene group include: 5-membered rings such as a thiophene ring, a furan ring, and a pyrrole ring; and 5-membered nitrogen containing hetero aromatic rings such as a pyridine ring, a pyrimidine ring, a pyridazine ring, a pyrazine ring, and a 1,2,4-triazine ring.
The following compounds can be cited as specific examples of a compound represented by Formula (1) or Formula (2) of the present invention.
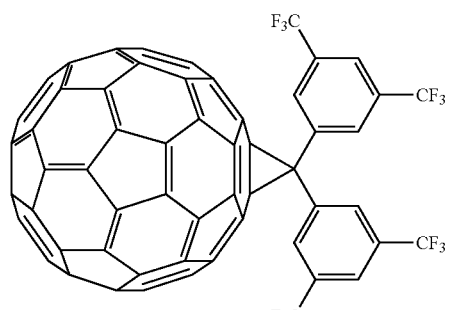
n1
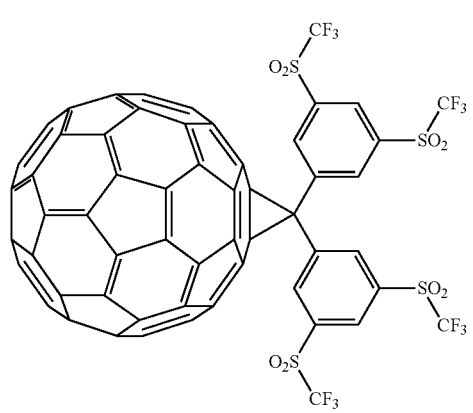
n2
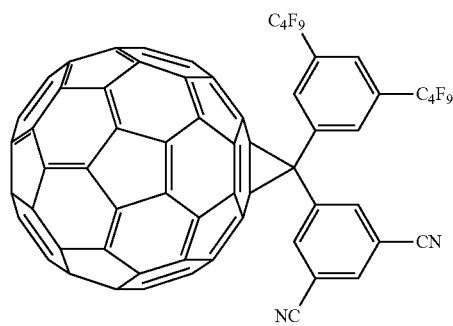
n3
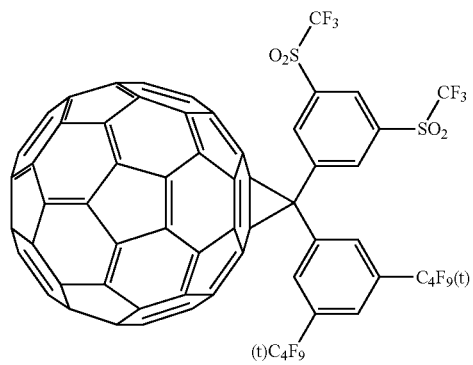
n4
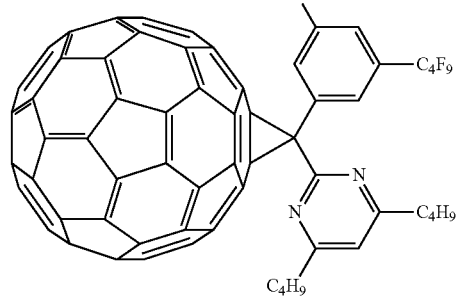
n5
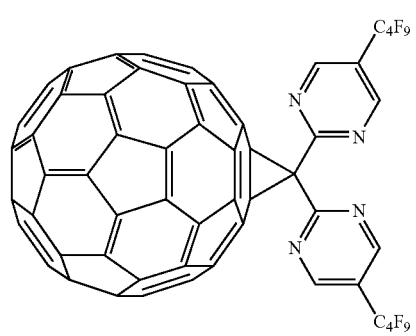
n6
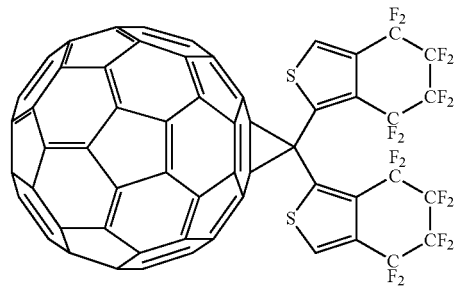
n7
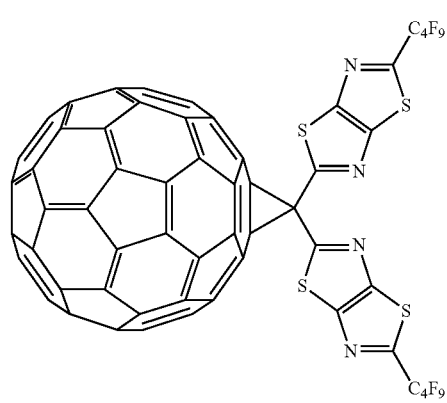
n8

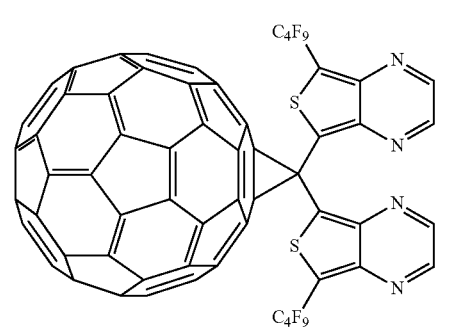
n9
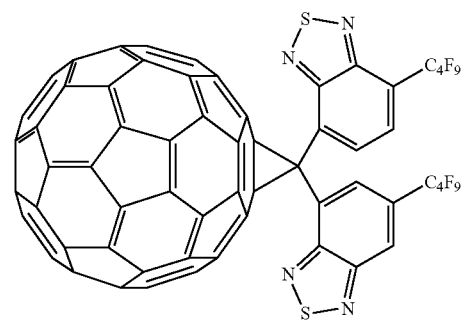
n10
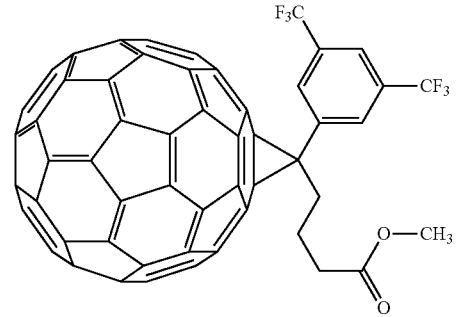
n11
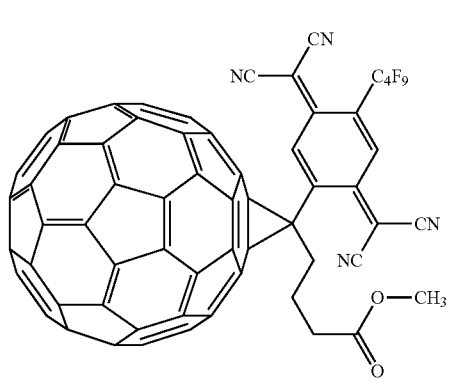
n14
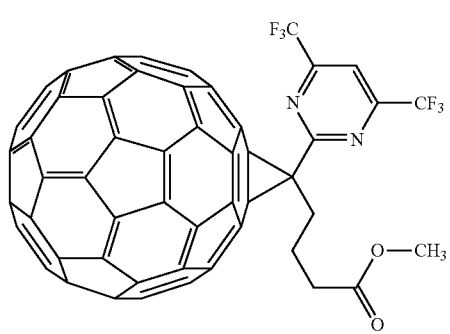
n15
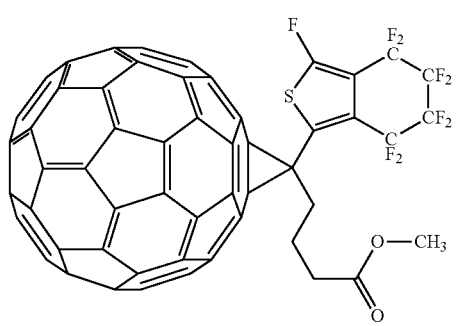
n16
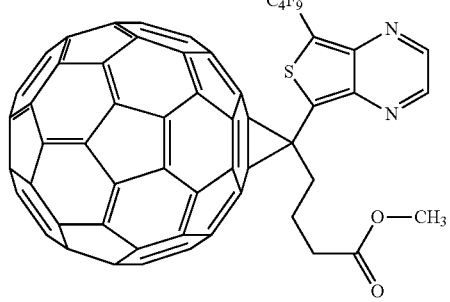
n17

-continued
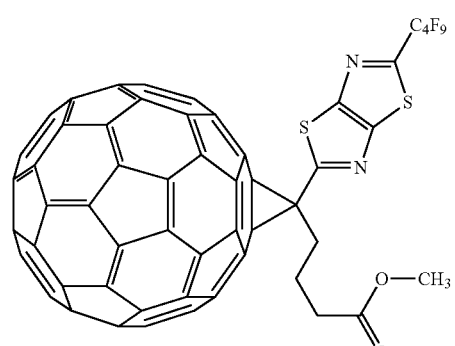
n18
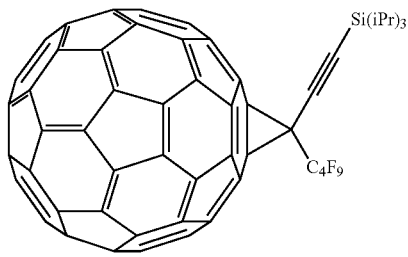
n19
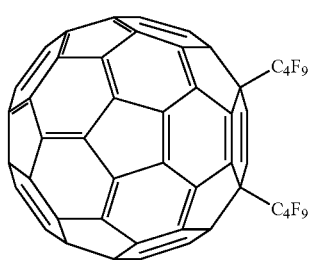
n20
n21
n22
-continued
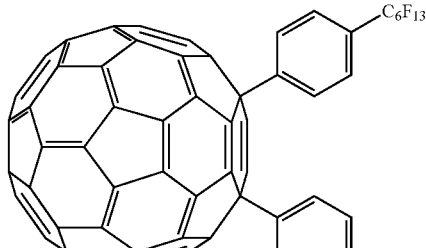
n23
n24
n25
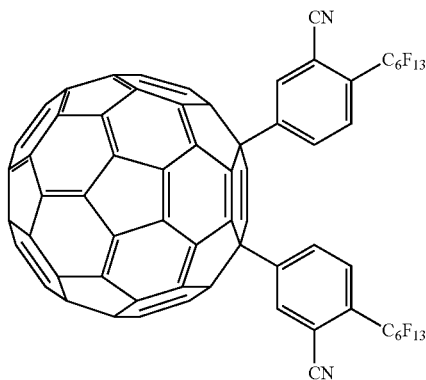
n26
n27 n28
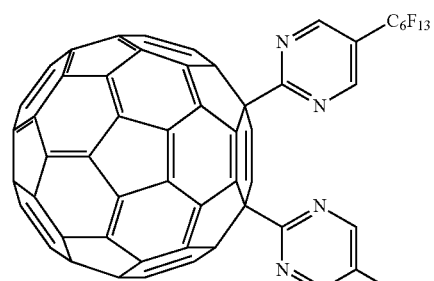
n29
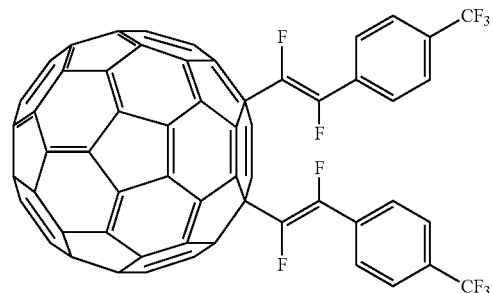
n30
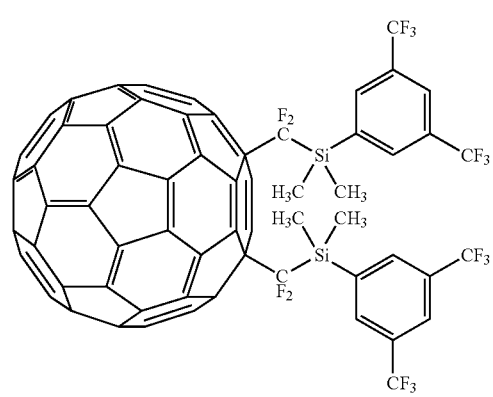
n31
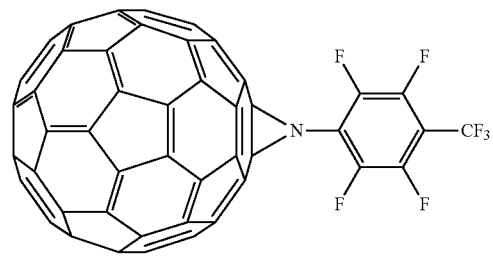
n32
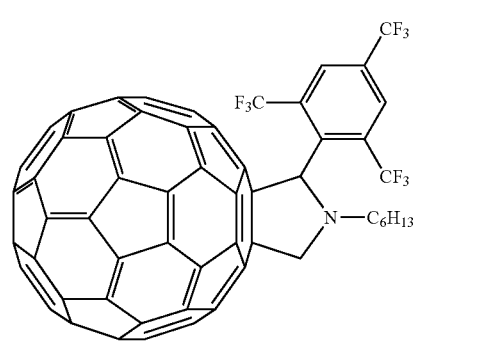
n33
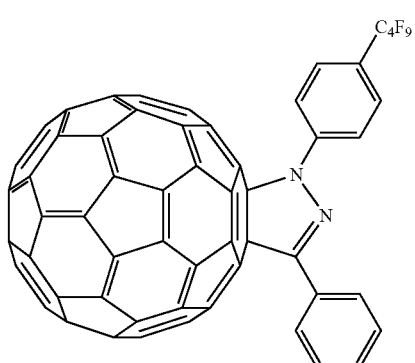
n34
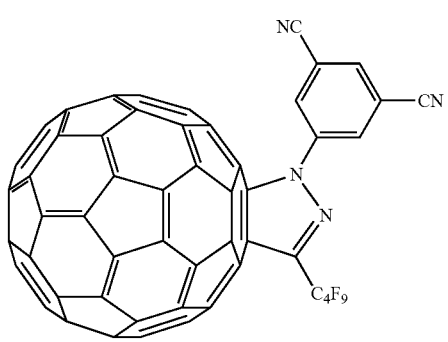
n35
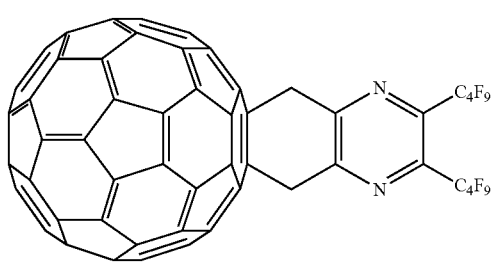
n36
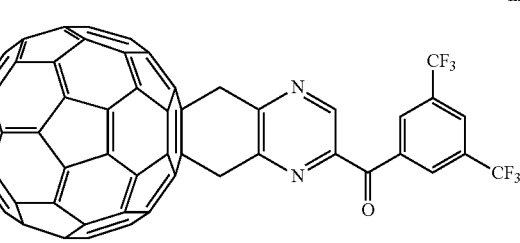
n37
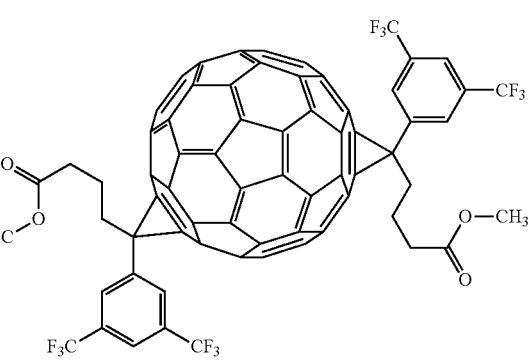

-continued

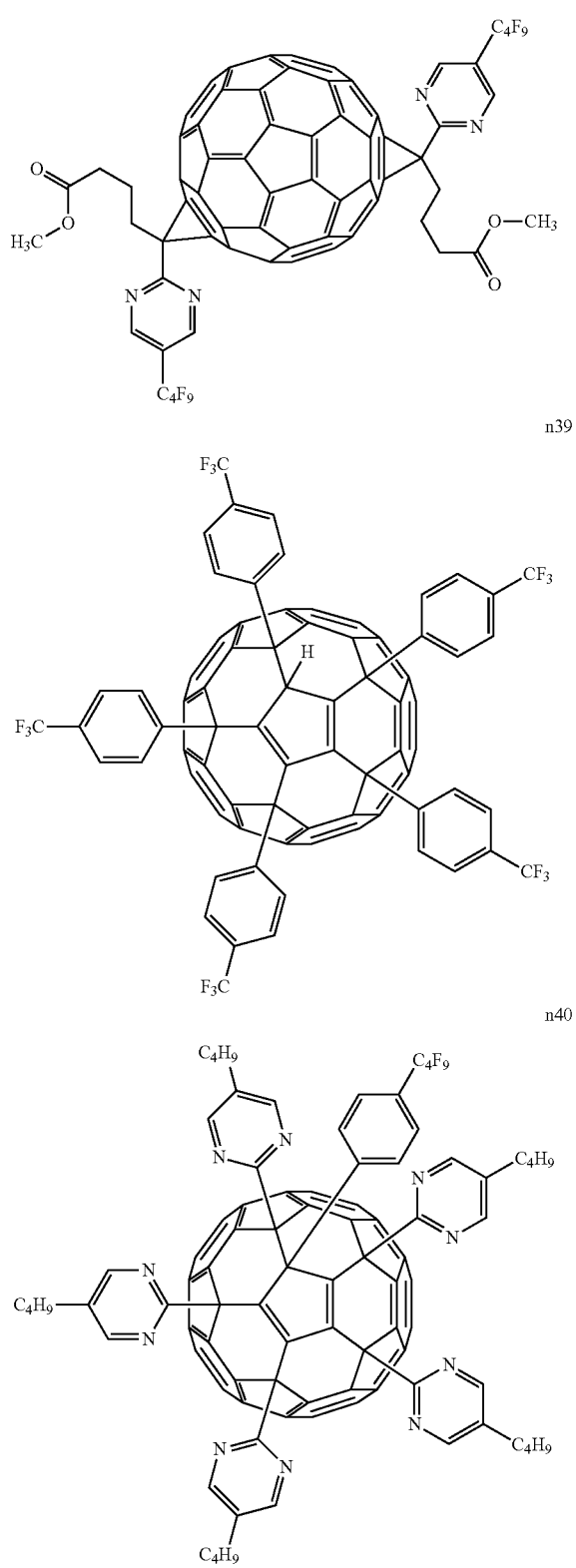

The above-described compounds can be synthesized by referring to: J. Org. Chem., vol. 60 (1995), p 532; Org. Lett., vol. 9 (2007), p 551; and Tetrahedron Letters; English, 45 (2004), p 1651.

[N-Type Semiconductor Material for First Bulk Hetero Junction Layer]

The LUMO level in a film state of an n-type semiconductor material which is suitable for a first bulk hetero junction layer (a bulk hetero junction layer which absorbs a shorter wavelength region) is just set to be shallower by 0.1 eV or more than the LUMO level in a film state of an n-type semiconductor material used for the 2nd bulk hetero junction layer to achieve the difference of LUMO levels so that the stagnated electrons should not flow into a reverse direction.

More specifically, it is a material which ahs a level of −4.0 to −4.2 eV. By making the level to be shallower than −4.2 eV, the rectifying property of an organic photoelectric conversion element will be improves, and efficiency and durability will be also improved. On the other hand, when the level is made to be shallower than −4.0 eV, the transfer of electrons from p-type semiconductor material becomes difficult to occur, and photoelectric conversion efficiency may fall.

Moreover, it is desirable, like an n-type semiconductor material for the 2nd bulk hetero junction layer, that it is a material which is dissolved in an organic solvent in an amount of 0.3 to 10 mass %, and more preferably, it is a material which can be dissolved in an amount of 1.0 to 3.0 mass %.

In order to achieve the p-type semiconductor material which has a LUMO level in the above-described extent, it may use a method together in which the LUMO level is made deeper by introduction of an electron donating group, which is a reverse direction for the n-type semiconductor material of the 2nd bulk hetero junction layer. The property of such material can be achieved by a fullerene derivative substituted with a phenyl group having an alkoxyl group, an alkylthio ether group or an alkylamino group described in, for example, Organic Letters, 2007, vol. 9, no. 4, p 551. Or it may use a fullerene derivative substituted with a plurality of substituent on a fullerene parent portion described in, for example, Adv. Mater., 2008, vol. 20, p 2116; and JP-A No. 2006-56878 for an n-type semiconductor material of a 1st bulk hetero junction layer.

(P-Type Semiconductor Material)

As a p-type semiconductor material used for bulk hetero junction layer of the present invention, although various types of condensed polycyclic aromatic compounds and conjugated polymers are cited, since the tandem-type organic photoelectric conversion element of the present invention contains two or more bulk hetero junction layers, it is preferable to use an appropriate p-type semiconductor material suitable for each layer.

As a p-type semiconductor material used for bulk hetero junction layer of the present invention, although various types of condensed polycyclic aromatic compounds and conjugated polymers are cited.

Examples of a condensed polycyclic aromatic low molecular weight compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene; porphyrin, copper phthalocyanine; tetrathiafulvalene (TTF)-tetracyanoquinodimethane (TCNQ) complex, bisethylenetetrathiafulvalene (BEDTTTF)-perchloric acid complex; and a derivative and a precursor thereof.

As examples of a derivative containing a condensed polycyclic compound include: pentacene compounds having a substituent disclosed in WO 03/16599, WO 03/28125, U.S. Pat. No. 6,690,029, and JP-A No. 2004-107216; pentacene precursors disclosed in US 2003/136964; acme compounds substituted with a trialkylsilyl ethynyl group disclosed in J. Amer. Chem. Soc., vol. 127, no. 14, p. 4986, J. Amer. Chem. Soc., vol. 123, p. 4982, and J. Amer. Chem. Soc., vol. 130, no. 9, p. 2706.

Examples of a conjugated polymer include: polythiophene such as 3-hexylthiohene (P3HT) and its oligomer, polythiophene having a polymenzable group disclosed in Technical Digest of the International PVSEC-17, Fukuoka, Japan, 2007, P. 1225, polythiophene-thienophene copolymer disclosed in Nature Material, vol. 5, p. 328 (2006), polythiophene-diketopyrrolopyrrole copolymer disclosed in WO 2008/000664, polythiophene-thizolothiazole copolymer disclosed in Adv. Mat., p. 4160 (2007), polythiophene-carbazole-benzothiadiazole copolymer (PCDTBT) disclosed in Adv. Mat, vol. 19, p. 2295 (2007), polythiophene copolymer such as PCDTBT disclosed in Nature Material, vol. 6, p. 497 (2007), polypyrrole and its oligomer, poly aniline, polyphenylene and its oligomer, polyphenylene vinylene and its oligomer, poly thienylene vinylene and its oligomer, polyacetylene, polydiacetylene, σ conjugated polymers such as polysilane and polygerman.

Suitably usable oligomers rather than polymers are: thiophene hexamers such as: α-sexithionene, α,ω-dihexyl-α-sexithionene, α,ω-dihexyl-α-quinquethionene, and α,ω-bis(3-butoxypropyl)-α-sexithionene.

[P-Type Semiconductor Material for First Bulk Hetero Junction Layer]

The 1st bulk hetero junction layer is a layer which absorbs a relatively shorter wavelength region, and it is preferable to absorb lights in the range of about 350 to 900 nm. Consequently, it is preferable that the p-type semiconductor material used for the 1st bulk hetero junction layer absorbs lights in the range of about 350 to 900 nm. Since a light having a shorter wavelength of 350 nm or less is harmful to a base film, a UV absorbing function will be given to the base film itself in many cases, and it is not needed to absorb the light having a shorter wavelength than this substantially. Moreover, when a light having a wavelength of 900 nm or more is absorbed, the band region of the light which can be used in the 2nd bulk hetero junction layer will be decreased and the generated electric current in the 2nd bulk hetero junction layer will fall. As a result, the generated electric current of the whole tandem element also falls, and it is not desirable. It is more preferably that the p-type semiconductor material of the 1st bulk hetero junction layer absorbs light of 380 to 750 nm. Therefore, if it is the above-mentioned p-type material which has an absorption spectrum in such extent, it can be used for the 1st bulk hetero junction layer. Preferable compounds are: polythiophene such as poly(3-hexylthiophene) (P3HT) and its oligomer, polyphenylene vinylene and its oligomer, polythienylene vinylene and its oligomer, polythiophene-thienothiophene copolymer described in Nature Material, (2006), vol. 5, p 328 or JACS2009x, polythiophene-thiazolothiazole copolymer described in Adv. Mater. 2007, polythiophene-carbazole-benzthiadiazole copolymer (PCDTBT) described in Adv. Mater., vol. 19, (2007) p 2295, pentacene and its derivative, anthradithiophene and its derivative, porphyrin, benzporphyrin and its derivative, and a phthalocyanine derivative.

[P-Type Semiconductor Material for Second Bulk Hetero Junction Layer]

The second bulk hetero junction layer is a layer which absorbs a relatively longer wavelength region, and it is preferable to absorb lights in the range of about 350 to 2,000 nm. Consequently, it is preferable that the p-type semiconductor material used for the 2nd bulk hetero junction layer absorbs lights in the range of about 350 to 2,000 nm. Since a light having a shorter wavelength of 350 nm or less is harmful to a base film, a UV absorbing function will be given to the base film itself in many cases, and it is not needed to absorb the light having a shorter wavelength than this substantially. Moreover, when a p-type material absorbs a light having a wavelength of 2,000 nm or more, the band gap will become too small, and the electromotive force will be decreased. As a result, it is difficult to expect improvement in the generation efficiency when it is made into a tandem-type composition, and it is not desirable. It is more preferably that the p-type semiconductor material of the 2nd bulk hetero junction layer absorbs light of 800 to 1,200 nm (−1.5 to −1.0 eV).

Although these compounds can be used for an organic photoelectric conversion element of the present invention without limitation, only a very few number of such compounds are known until now. The known compounds are limited to a small number of compounds such as: PCPDTBT (LUMO level: about −3.7 eV; and band gap: 1.5 to 1.6 eV), APFO-Green 1 (LUMO level: about −4.3 to −4.4 eV; and band gap: 1.2 to 1.3 eV) as disclosed in the above-mentioned Non-patent documents 1 and 2 and Patent documents 1 and 2, and pBBTDPP2 (LUMO level: 3.7 to 3.8 eV; and band gap: 1.4 eV) disclosed in Adv. Mater., vol. 20 (2008), p 255.

In addition, an electromotive force is related to the difference of the HOMO level of p-type semiconductor material, and the LUMO level of n-type semiconductor material. In the present invention, since it is characterized to use an n-type semiconductor material which has a LUMO level deeper than the LUMO level of the n-type semiconductor material of the 1st bulk hetero junction layer, the electromotive force of the 2nd bulk hetero junction layer tends to decline easily.

Therefore, it is also preferable to use a material having a deep HOMO level as a p-type material used for the 2nd bulk hetero junction layer.

However, as for the n-type material having a deep LUMO level used for the 2nd bulk hetero junction layer of the present invention, the LUMO level is required to be much deeper. Therefore, the n-type material is preferably a compound having a partial structure represented by the aforesaid Formula (3). In the Formula, Q represents one selected from the group consisting of a substituted or unsubstituted carbon, nitrogen, oxygen, silicon, phosphor, sulfur and germanium atom. $Z_1$ represents a substituted or unsubstituted nitrogen containing 6-membered aromatic heterocycle, and $Z_2$ represents a substituted or unsubstituted aromatic hydrocarbon group or a substituted or unsubstituted aromatic heterocycle.

A nitrogen containing 6-membered aromatic heterocycle indicates specifically, for example, a pyridine ring, a pyrimidine ring, a pyridazine ring, a pyrazine ring or 1,2,4-triazine ring.

The compound having such partial structure, in particular, the structure in which Q represents a substituted or unsubstituted nitrogen atom, for example, is used as an electron transport material (as a hole blocking material) of an organic EL element as disclosed in WO 2004-095889. This compound has a deep LUMO level and it is found to be preferably used as a p-type material for the 2nd bulk hetero junction layer.

More preferably, it is a p-type semiconductor material having a partial structure represented by the aforesaid Formula (4).

In particular, the compound in which at least one of $X_1$ to $X_3$ and $X_4$ to $X_6$ represents a nitrogen atom, namely, the azacarbazole structure can effectively deepen the HOMO level of a p-type material. And it is preferable. More preferably, the positions of a nitrogen atom are $X_2$ to $X_5$ or $X_3$ to $X_6$.

Specific examples of a compound having a partial structure represented by Formulas (3) or (4) of the present invention will be listed below, however, the present invention is not limited to them.

p1
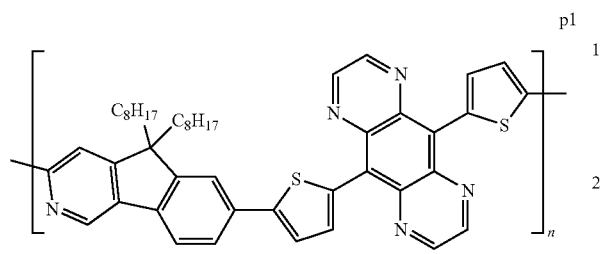

p2
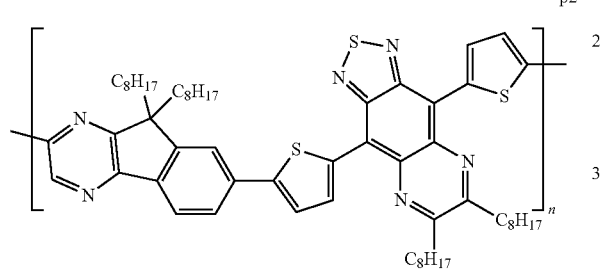

p3
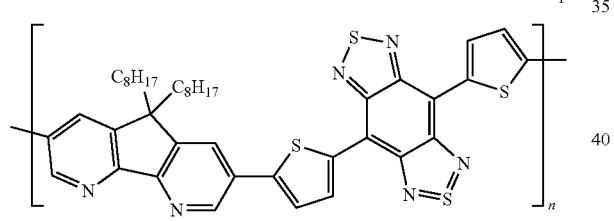

p4
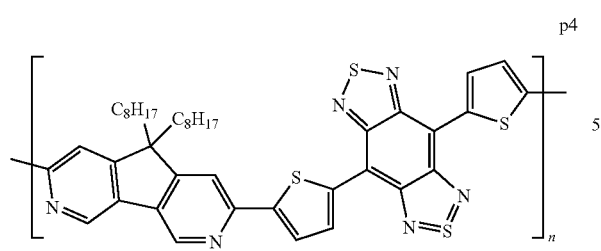

p5
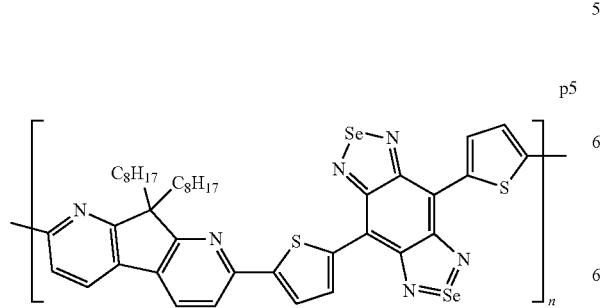

-continued p6
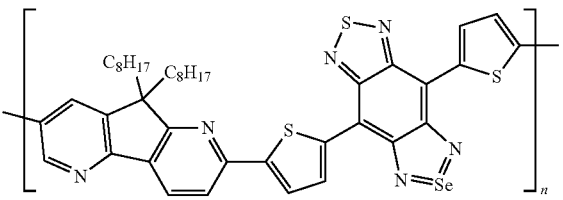

p7
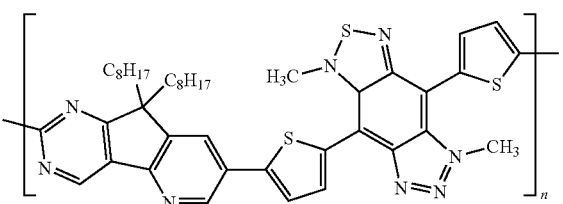

p8
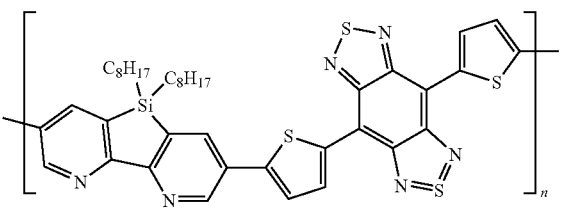

p9
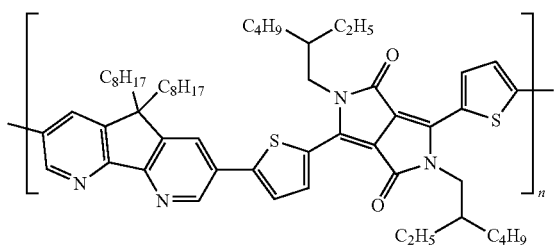

p10
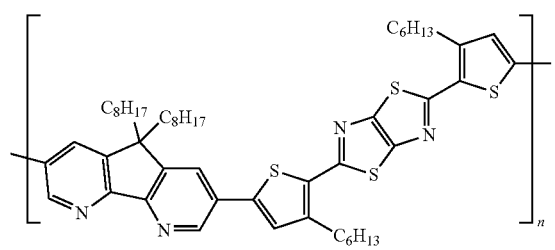

p11
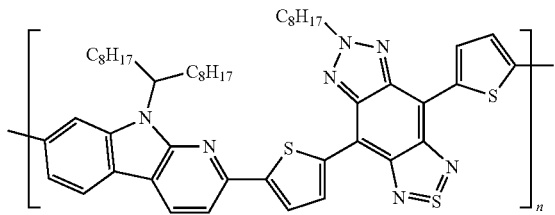

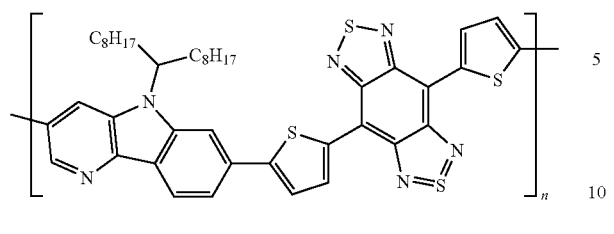
p12
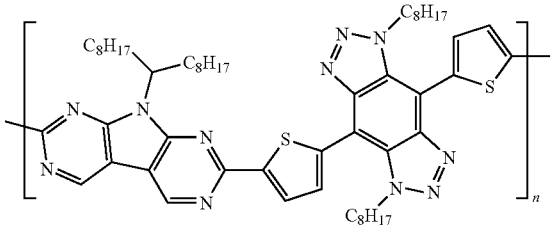
p18
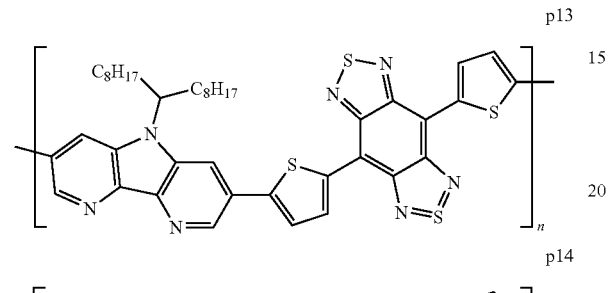
p13
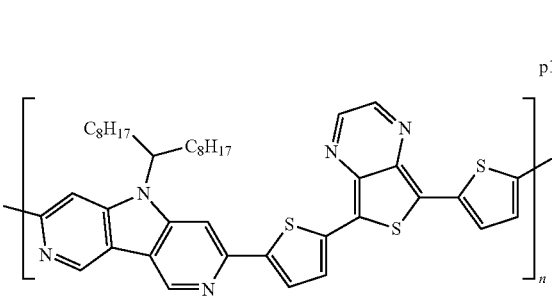
p19
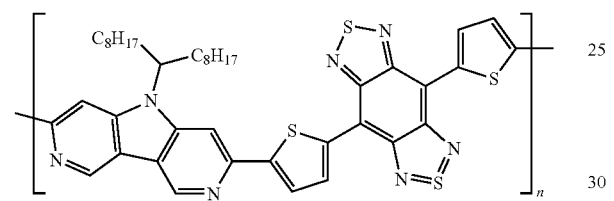
p14
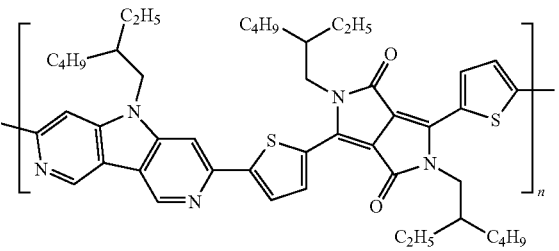
p20
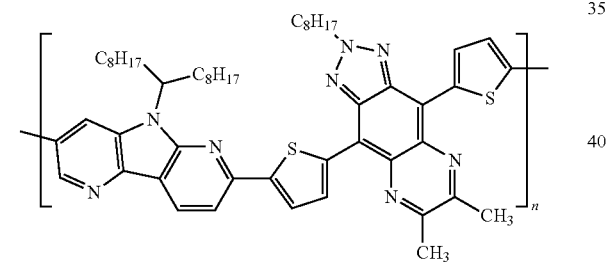
p15
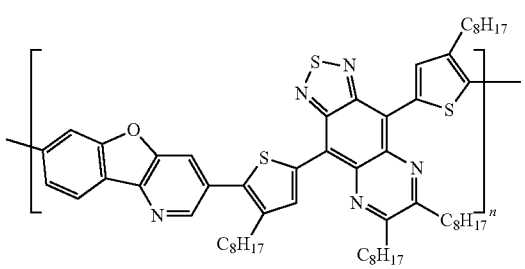
p21
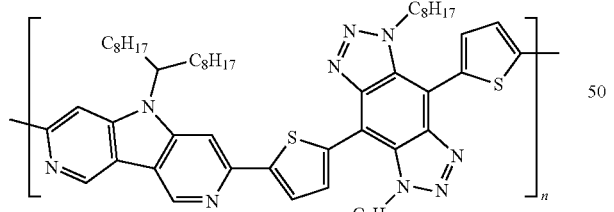
p16
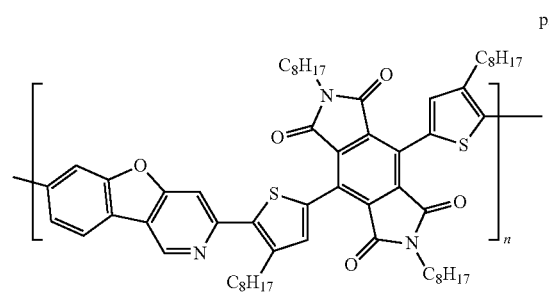
p22
p17

-continued p23
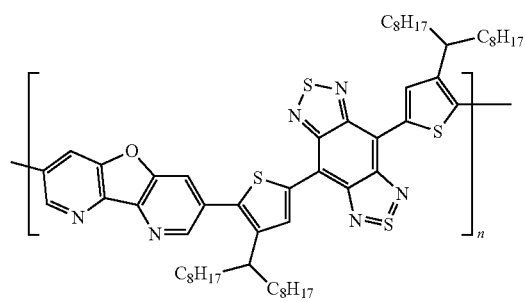

p24
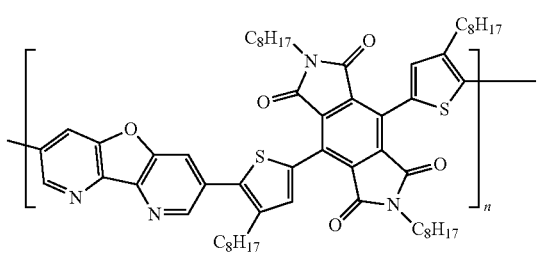

p25
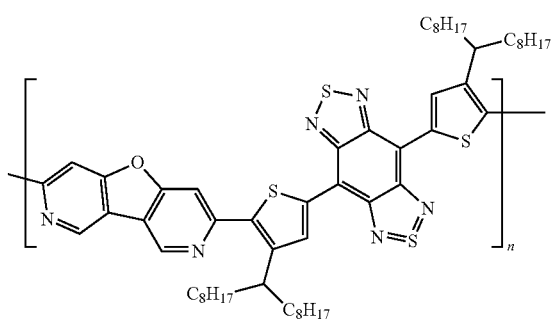

p26
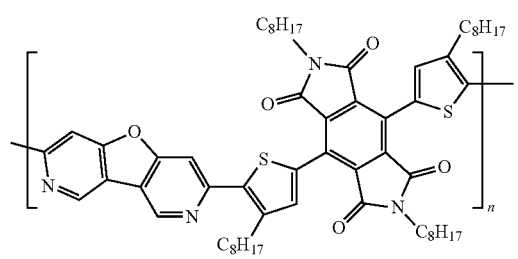

p27
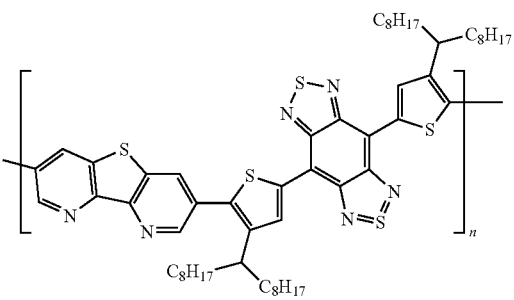

-continued p28
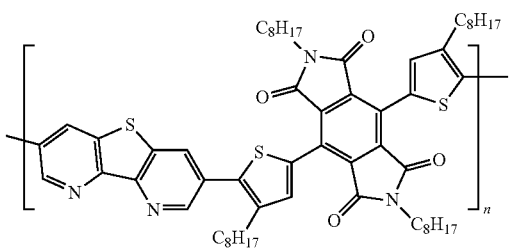

p29
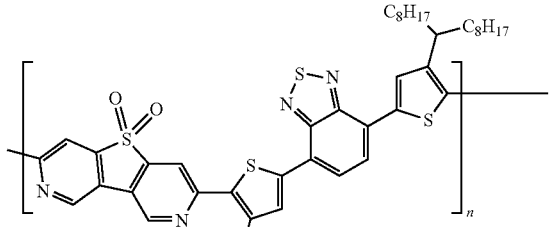

p30
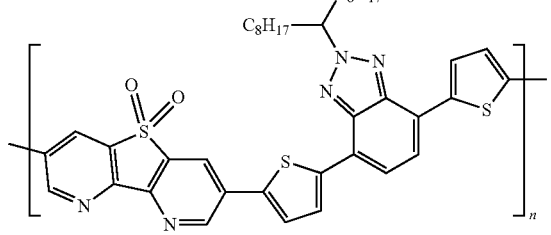

The compounds having a partial structure represented by Formulas (3) or (4) of the present invention can be synthesized by referring to Tetrahedron, vol. 51, no. 44 (1955), p 12127 and WO 2004-095889, for example.

[Preparation Method of Bulk Hetero Junction Layer]

As a preparation method of a bulk hetero junction layer which contains a mixture of an electron acceptor and an electron donor, there can be cited: a vacuum deposition, a coating method (including a cast method and a spin coat method), for example. Among these, a coating method is preferable in order to increase the interface area in which the above-mentioned hole and electron are in the charge separated state and to result in producing an element having high photoelectric conversion efficiency. Moreover, a coating method is also excellent in production speed.

After coating, it is preferable to heat the coated material in order to remove the residual solvent, a water content and a gas, and also to increase mobility and to achieve longer wavelength of absorption by crystallization of the semiconductor material. If annealing treatment is carried out at a prescribed temperature during the manufacturing process, a part of the material is accelerated microscopically to be crystallized, and it is possible to make the bulk hetero junction layer have a suitable phase separation structure. As a result, the carrier mobility of a bulk hetero junction layer will be improved, and high efficiency can be obtained.

Although the photoelectric conversion section (bulk hetero junction layer) 14 may be composed of a monolayer made of an electron acceptor and an electron donor uniformly mixed with each other, it may be composed of a plurality of layers in which a mixing ratio of an electron acceptor to an electron donor is changed.

Next, an electrode which composes an organic photoelectric conversion element will be described.

An organic photoelectric conversion element functions as a cell as follows: a positive charge and a negative charge which are generated in a bulk hetero junction layer are taken out from an anode and cathode via a p-type organic semiconductor material and n-type organic semiconductor material, respectively. Each electrode is required for suitable propertied for a carrier which passes an electrode.

[Cathode]

A cathode as used in the present invention means an electrode form which an electron is takes out. For example, when using as a cathode, it may be a conducting material independent layer, but in addition to the material which has conductivity, it may be uses a resin which holds this material together.

As a material for a cathode, it is required to have a sufficient conductivity and to have a work function which is not form a Schottky barrier when it is connected to the above-mentioned n-type semiconductor material, and to be not deteriorated. That is, it is preferable to be a metal having a deeper work function by 0 to 0.3 eV than the LUMO of the n-type semiconductor material used for a bulk hetero junction layer. Since the preferable LUMO level of the n-type semiconductor material used for the 2nd bulk hetero junction layer of the present invention is −4.3 to −4.6 eV, it is preferable that the work function of the cathode is a −4.3 to −4.9 eV. On the other hand, the work function of the cathode is not preferable to be deeper than the anode (transparent electrode) which takes out a hole. Since the inter layer resistance between layers may occur with the metal of a work function shallower than the n-type semiconductor material, it is preferable, in effect, that it is a metal which has a work function of −4.4 to −4.8 eV. Therefore, materials such as aluminium, gold, silver, copper, and indium; or oxide materials such as zinc oxide, ITO, and a titanium oxide, are also preferable. Aluminum, silver, and copper are more preferable, and silver still more preferable.

In addition, the work function of these metals can be similarly measured using ultraviolet photoelectron spectroscopy (UPS).

It may be an alloy according to necessity. Suitable example thereof include: magnesium/silver mixture, magnesium/aluminium mixture, magnesium/indium mixture, aluminium/aluminium oxide ($Al_2O_3$) mixture, lithium/aluminium mixture, and aluminium. The cathode can be produced by forming a thin film by using a method such as vacuum vapor-deposition and sputtering of the electrode material. The thickness of the thin film is generally selected from 10 nm to 5 μm, and preferably it is selected from 50 to 200 nm.

When the cathode side is made into a light transmissive state, it can be made as follows. After producing a film of a conductive material suitable for a cathode, such as an aluminium and an aluminium alloy, silver, and a silver compound, to have a thickness of about 1 to 20 nm, for example, a transparent cathode can be produced by providing with a film of a conductive light transmissive material thereon.

[Anode]

In the present invention, an anode indicates an electrode from which a hole is taken. It is an electrode which preferably transmits light of 380 to 800 nm. Examples of a material used for that include: a transparent conductive metal oxide such as indium tin oxide (ITO), $SnO_2$ and ZnO; a metal thin film such as gold, silver and platinum; a metal nanowire; and a carbon nanotube.

A conductive polymer molecule selected from the group of derivatives of polypyrrole, polyaniline, polythiophene, poly thienylene vinylene, polyazulene, polyisothianaphthene, polycarbazole, polyacethylene, polyphenylene, polyphenylene vinylene, polyacene, polyphenyl acetylene, polydiacetylene, and polynaphthalene. It can also be made an anode by combining a plurality of these conductive compounds.

[Intermediate Electrode]

As a material for an intermediate electrode which is needed in a tandem composition, preferably, it is a layer using the compound having both transparency and electro conductivity. It can be used a material used for the above-mentioned anode: a transparent metal oxide such as ITO, AZO, FTO or titanium oxide; a very thin metal layers made of such as Ag, aluminium and Au; a layer containing nanoparticles and nanowires; a conductive polymer material such as PEDOT:PSS and poly aniline.

In addition, among combinations of the aforesaid the positive hole transporting layer and electron transportation layer, there may be a combination which acts as an intermediate electrode (electric charge recombination layer) when they are suitable selected and laminated with each other. When such composition is realized, it is preferable since it can decrease one manufacturing process to be used for forming one layer.

Next, there are disclosed materials which compose layers other than an electrode and a bulk hetero junction layer.

[Hole Transport Layer and Electron Block Layer]

The organic photoelectric conversion element 10 of the present invention is preferably provided with a hole transport layer 17 formed between a bulk hetero junction layer and a anode. This enable to take out more efficiently the electric charge generated in the bulk hetero junction layer.

As a material to constitute the aforesaid layers, there can be used for a hole transport layer 17, for example: PEDOT (product name Baytron™ made by Starck Vitec Co.), polyaniline and its dope material, and a cyan compound described in WO 2006019270. In addition, to the electron transport layer which has a LUMO level shallower than the LUMO level of the n-type semiconductor material used for the bulk hetero junction layer, there is provided an electron block function having an rectifying effect by which the electron generated in the photoelectric conversion layer is not passed to the anode side. The above-described hole transport layer is also called an electron block layer, and it is more preferable to use a hole transport layer having such function. Examples of these materials include: a triaryl amine compound described in JP-A No. 5-271166, a metal oxide such as molybdenum oxide, nickel oxide and tungsten oxide. Moreover, the layer which consists of a single substance of a p-type semiconductor material used for the bulk hetero junction layer can also be used. As a means to form these layers, although any one of a vacuum deposition method and a solution coating method can be used, it is preferably used the solution coating method. When an under layer is formed with a coating method before forming a bulk hetero junction layer, it will have an effect of leveling the coating surface. This will result in decreasing a leaking effect and it is preferable.

[Electron Transport Layer and Hole Block Layer]

The organic photoelectric conversion element 10 of the present invention is preferably provided with an electron transport layer 18 formed between a bulk hetero junction layer and a cathode. This enable to take out more efficiently the electric charge generated in the bulk hetero junction layer and it is preferable.

As an electron transport layer 18, there can be used: octaazaporphyrin and perfluoro derivative of a p-type semiconductor (for example, perfluoro pentacene and perfluoro phthalocyanine). To the electron transport layer which has a HOMO level deeper than the HOMO level of the p-type semiconductor material used for a bulk hetero junction layer, there is provided, at the same time, a positive hole block function having an rectifying effect by which the hole generated in the bulk hetero junction layer is not passed to the cathode side. The above-described electron transport layer is also called a hole block layer, and it is more preferable to use the electron transport layer which have such function. Examples of a material for that include: a phenanthrene system compound such as bathocuproine; an n-type semiconductor material such as naphthalenetetracarboxylic acid anhydride, naphthalenetetracarboxylic acid diimide, perylenetetracarboxylic acid anhydride and perylenetetracarboxylic acid diimide; an n-type inorganic oxide such as titanium oxide, zinc oxide and gallium oxide; and an alkali metal compound such as lithium fluoride, sodium fluoride and cesium fluoride. Moreover, a layer which is made of a single substance of an n-type semiconductor material used for the bulk hetero junction layer can also be used. As a means to form these layers, although any one of a vacuum deposition method and a solution coating method can be used, it is preferably used a solution coating method.

[Other Layers]

It is also adequate to make a composition containing various inter layers in an element for the purpose of improvement in energy conversion efficiency, and improvement in lifetime of an element. Examples of an interlayer include: a positive hole block layer, an electron block layer, a positive hole injection layer, an electron injection layer, an exciton block layer, a UV absorption layer, a light reflection layer and a wavelength conversion layer.

[Substrate]

When the light by which photoelectric conversion is carried out enters from the substrate side, it is preferable that the substrate is made of a member enabling to transmit the light by which photoelectric conversion is carried out. That is, it is preferable that the substrate is made of a transparent member to the wave length of this light that should be carried out photoelectric conversion. As for a substrate, although a glass substrate and a resin substrate are cited suitably, it is preferable to use a transparent resin film from the viewpoints of lightness and flexibility. In the present invention, there is no restriction in particular to the transparent resin film which can be preferably used as a transparent substrate, and it can be suitably chosen from the known materials with respect to form, structure and thickness. Specific examples of a resin film include: a polyester resin film such as polyethylene terephthalate (PET) and polyethylene naphthalate (PEN) and modified polyester; a polyolefin resin film such as a polyethylene (PE) resin film, a polypropylene (PP) resin film, a polystyrene resin film and a cyclic olefin resin; a vinyl resin film such as polyvinylchloride and polyvinylidene chloride; a polyether ether ketone (PEEK) resin film, a polysulfone (PSF) resin film, a polyethersulfone (PES) resin film, a polycarbonate (PC) resin film, a polyamide resin film, a polyimide resin film, an acrylic resin film and a triacetyl cellulose (TAC) resin film. If the resin film exhibits transmittance for the light of a visible range (380 to 800 nm) is 80% or more, it is preferably applicable to the transparent resin film concerning the present invention. Especially, from the viewpoints of transparency, heat resistivity, ease of handling, strength and cost, the following resins are preferable: a biaxial stretching polyethylene terephthalate film, a biaxial stretching polyethylenenaphthalate film, a polyethersulfone film and a polycarbonate film. Among them, a biaxial stretching polyethylene terephthalate film and a biaxial stretching polyethylenenaphthalate film are more preferable.

In order to secure the wettability and the adhesion property of a coating solution, surface treatment can be performed and an adhesion assisting layer can be prepared to the transparent substrate used for the present invention. About surface treatment or an adhesion assisting layer, a well-known technique can be used conventionally. For example, as surface treatment, there can be cites a surface activation process such as: corona discharge treatment, flame treatment, ultraviolet treatment, high-frequency treatment, glow discharge process, activity plasma treatment and laser process. Moreover, as an adhesion assisting layer, there can be cited, for example, polyester, polyamide, polyurethane, vinyl system copolymer, butadiene system copolymer, acrylic system copolymer, vinylidene system copolymer and epoxy system copolymer.

In order to control transmission of oxygen and water vapor, a barrier coat layer may be formed beforehand to the transparent substrate.

[Optical Function Layer]

The organic photoelectric conversion element of the present invention may be provided with a various types of optical function layers for the purpose of efficient light receiving of sunlight. As an optical function layer, there may be provided with an anti-reflection layer, a light condensing layer such as a microlens array, a light diffusion layer which can scatter the light reflected by the cathode and can make the light enter again in the bulk hetero junction layer.

As an anti-reflection layer, well-known anti-reflection layer can be prepared. For example, when a transparent resin film is a biaxial stretching polyethylene terephthalate film, it is preferable to set the refractive index of the adhesion assisting layer, which is adjacent to the film, to be 1.57 to 1.63. This will improve transmittance with decreasing the interface reflection between the film substrate and the adhesion assisting layer. As a way of adjusting a refractive index, it can be carried out by adjusting suitably the ratio of a binder resin to oxide sol having a comparatively high refractive index such as a tin oxide sol and a cerium oxide sol and by coating it. Although a single layer of adhesion assisting layer may be sufficient, in order to raise adhesion property, a composition of two or more adhesion assisting layers may be used.

Examples of a light condensing layer are as follows: to set a structure of a micro lens array on the sunlight receiving side of the substrate; and to combine a so-called light condensing sheet to increase an amount of the receiving light from a specific direction, or conversely, to decrease incident angle dependability of sunlight.

As an example of a microlens array, it can be cited an arrangement in which the quadrangular pyramidal forms having a base of 30 μm and a vertex angle of 90 degrees are arranged in two dimensions on the light taking out side of a substrate. As for a base, the range of 10 to 100 μm is desirable. When it is smaller than this range, the effect of diffraction will occur to result in coloring, while when it is larger than this range, the thickness becomes large. They are not desirable.

Moreover, as a light scattering layer, a various types of anti-glare layers and a layer in which are distributed nanoparticles or nanowire made of metal or various inorganic oxides in a colorless transparent polymer can be cited.

EXAMPLES

Hereafter, the present invention will be described specifically by referring to examples, however, the present invention is not limited to them.

Plexcore OS2100 (P3HT) made by Plextronics was used as a p-type material for the 1st bulk hetero junction layer. Moreover, PCBM or bis-PCBM (synthesized based on JOC, 1995, p 532), and Ph5C60 (synthesized based on Journal of Organometallic Chemistry, v. 599 (2000), and p 32) were used as n-type materials.

As p-type materials for the 2nd bulk hetero junction layer, PCPDTBT was synthesized based on Macromolecules 2007, 40, 1981, and APFO-Green 1 was synthesized by referring to APPLIED PHYSICS LETTERS VOLUME 85, (2004), p 5081 as reference.

Moreover, the following five kinds of compounds were prepared as n-type semiconductor materials each having a different LUMO level and used for the 2nd bulk hetero junction layer.

PCBM was used by purchasing nanom spectra E100 made by Frontier Carbon Co., Ltd. BTPX was synthesized based on Tetrahedron Letters; English, 45; 8; 2004; 1651.

In addition, measurement of a HOMO level and a LUMO level of these compounds were done as follows. The HOMO level of membrane was measured by measuring UPS of a single substance film which was produced with a spin coat method on ITO. Further, a band gap was measured by measuring the edge end of the absorption spectrum of the thin film using spectral absorption measurement. The LUMO level was determined from the above-mentioned HOMO level and the band gap value.

(Preparation of Tandem-Type Organic Photoelectric Conversion Element 1)

A transparent conductive film made of indium tin oxide (ITO) was deposited on a PEN substrate to have a thickness of 150 nm. By using a usual photolithography technique and hydrochloric acid etching, an anode having a pattern of 2 mm width was formed.

The anode which carried out pattern formation was successively cleaned by: ultrasonic cleaning using a surfactant and ultrapure water, and then, ultrasonic cleaning with ultrapure water. Then it was dried by a nitrogen blow, and finally UV light ozone cleaning was performed.

On the cleaned transparent electrode was applied an electric conductive polymer Baytron P4083 (made by Starck Vitec Co.) with spin coating to have a film thickness of 30 nm. Then it was dried by heating at 140° C. for 10 minutes under the atmosphere.

After this, the substrate was carried in into a glove box and manipulations were done under a nitrogen atmosphere. First, the above-mentioned substrate was subjected to heat treatment at 140° C. for 10 minutes under a nitrogen atmosphere.

There was prepared a liquid by dissolving 1.0 mass % of the above-mentioned p-type semiconductor material Plexcore OS2100 and 0.8 mass % of the above-mentioned PCBM (pn ratio of 5:4) in chlorobenzene. Subsequently, while filtering this solution with a 0.45 µm filter, this solution was applied with spin coating at 700 rpm for 60 seconds, followed by at 2,200 rpm for 1 second. It was burned by heating at 140° C. for 10 minutes.

Then, there was prepared a liquid by dissolving Ti-isopropoxide in ethanol so that the density became 0.05 mol/l. After masking treatment, this liquid was coated to have a film thickness of 20 nm. A titanium oxide layer was formed as an electron transport layer by leaving the coated film in a nitrogen gas which was adjusted the water vapor content to be about 1%.

Then again, Baytron P4083 was coated with spin coating to have a film thickness of 30 nm. And then, it was dried by heating at 140° C. for 10 minutes under the atmosphere.

Again, the substrate was carried in into a glove box and manipulations were done under a nitrogen atmosphere. First, the above-mentioned substrate was subjected to heat treatment at 140° C. for 10 minutes under a nitrogen atmosphere.

Subsequently, there was prepared a liquid by dissolving PCPDTBT in an amount of 0.7% and PCBM in an amount of 2.5% in chlorobenzene. While filtering this solution with a 0.45 µm filter, this solution was applied with spin coating at 2,500 rpm for 60 seconds. It was burned by heating at 140° C. for 10 minutes.

Next, the substrate on which were formed a series of the above-mentioned organic layers was installed in a vacuum vapor-deposition apparatus. After having set the element so that a transparent electrode and the shadow mask of 2 mm width might cross at right angles, the inner portion of the vacuum vapor-deposition apparatus was decompressed to be below to $10^{-3}$ Pa. Then, there were vapor-deposited lithium fluoride with a thickness of 0.6 nm and silver with a thickness of 100 nm. Finally, it was heated at 120° C. for 30 minutes to obtain a comparative organic photoelectric conversion element 1. Here, the vapor-deposition rate was 2 nm/second and the sample size was a 2 mm square.

The obtained organic photoelectric conversion element 1 was sandwiched between two sheets of transparent barrier film GX (made by Toppan printing Co., Ltd) having water permeability of 0.05 $g/m^2/d$, and after sealing was performed using a UV curing resin UV RESIN XNR5570-B1 (made by Nagase ChemteX Corporation), it was taken out under the atmosphere.

(Preparation of Tandem-Type Organic Photoelectric Conversion Elements 2 to 9)

Tandem-type organic photoelectric conversion elements 2 to 9 were prepared in the same manner as used for preparation of Organic photoelectric conversion element 1, except that a p-type semiconductor material and an n-type semiconductor material were used as described in Table 1.

(Evaluation of Organic Photoelectric Conversion Elements])

(Photoelectric Conversion Efficiency)

The organic photoelectric conversion elements obtained above were irradiated with a light of Solar Simulator (AM 1.5G) with a power of 100 $mW/cm^2$. The voltage-electric current characteristics were measured, and open circuit voltage and photoelectric conversion efficiency were determined.

(Durability)

The organic photoelectric conversion elements obtained above and after sealing were placed under the light with a power of 1,000 $mW/cm^2$ under keeping the state of electrically connected with a load. When the initial conversion efficiency was made as 100%, the time required to decrease by 20% of the initial conversion efficiency (the time when the conversion efficiency became 80% of the initial conversion efficiency) was measured as T80 and they were evaluated.

The results of evaluations are shown in Table 1

TABLE 1

| Tandem-type organic photoelectric conversion element | 1st bulk hetero junction layer | | | 2nd bulk hetero junction layer | | | | LUMO (n1)-LUMO (n2) | Intitial conversion efficiency | ** | Remarks |
|---|---|---|---|---|---|---|---|---|---|---|---|
| | p-type semiconductor | n-type semiconductor | LUMO (n1) | p-type semiconductor | Band gap of p-type semiconductor | n-type semiconductor | LUMO (n2) | | | | |
| 1 | P3HT | PCBM | −4.3 | PCPDTBT | 1.5 | PCBM | −4.3 | 0 | 3.60% | 55 | Comp. |
| 2 | P3HT | bis-PCBM | −4.2 | PCPDTBT | 1.5 | bis-PCBM | −4.2 | 0 | 3.80% | 40 | Comp. |
| 3 | P3HT | bis-PCBM | −4.2 | PCPDTBT | 1.5 | PCBM | −4.3 | 0.1 | 4.00% | 130 | Inv. |
| 4 | P3HT | PCBM | −4.3 | Exemplified compound p12 | 1.2 | Exemplified compound n11 | −4.4 | 0.1 | 4.10% | 240 | Inv. |
| 5 | P3HT | bis-PCBM | −4.2 | Exemplified compound p12 | 1.2 | Exemplified compound n11 | −4.4 | 0.2 | 4.30% | 450 | Inv. |
| 6 | P3HT | bis-PCBM | −4.2 | Exemplified compound p14 | 1.2 | Exemplified compound n15 | −4.5 | 0.3 | 4.90% | 730 | Inv. |
| 7 | P3HT | bis-PCBM | −4.2 | Exemplified compound p3 | 1.2 | Exemplified compound n27 | −4.6 | 0.4 | 4.50% | 310 | Inv. |
| 8 | P3HT | bis-PCBM | −4.2 | APFO-Green1 | 1.2 | BTPX | −4.7 | 0.5 | 0.50% | 80 | Comp. |
| 9 | P3HT | Ph5C60 | −3.9 | APFO-Green1 | 1.2 | BTPX | −4.7 | 0.8 | 0.10% | 75 | Comp. |

**: Relative efficiency decrease (LT80 hr), Comp.: Comparative example, Inv.: Inventive example

P3HT

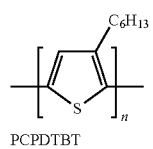

PCPDTBT

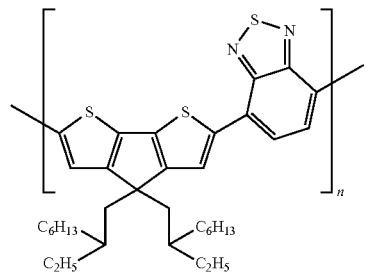

APFO-Green1

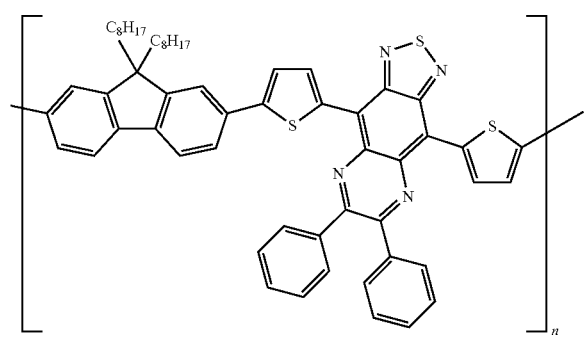

PCBM

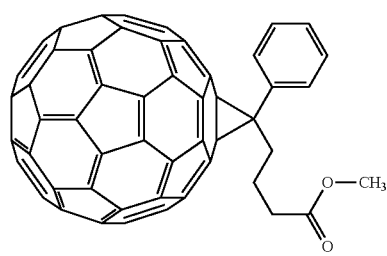 [SMILES: COC(=O)CCCC1(c2ccccc2)C2c3c4c5c6c3c3c(c7ccc8c9ccc%10c%11c%12c%13c(c6c6c%13c(c%119)c8c7c36)=C3C5C(C=C4)C4C=CC%10C%12C34)C21]

TABLE 1-continued

| Tandem-type organic photoelectric conversion element | 1st bulk hetero junction layer | | | 2nd bulk hetero junction layer | | | | LUMO (n1)- LUMO (n2) | Intitial conversion efficiency | ** | Remarks |
|---|---|---|---|---|---|---|---|---|---|---|---|
| | p-type semi-conductor | n-type semi-conductor | LUMO (n1) | p-type semiconductor | Band gap of p-type semi-conductor | n-type semiconductor | LUMO (n2) | | | | |

BTPX bis-PCBM

Ph5C60

Table 1 shows that the organic photoelectric conversion elements of the present invention, which satisfy the expression of 0.4 eV≥LUMO(n1)−LUMO(n2)≥0.1 eV, are excellent in efficiency and durability. Moreover, it is shown that high efficiency and durability are acquired when a compound having a fluoroalkyl group is used as an n-type semiconductor material. Moreover, it is shown that the excellent properties can be obtained by using the compounds having a condensed ring structure of the present invention as a p-type semiconductor material.

DESCRIPTION OF SYMBOLS

10: Organic photoelectric conversion element of a bulk hetero junction type
11: Substrate
12: Anode
13: Cathode
14: Photoelectric conversion section (Bulk hetero junction layer)
14': First photoelectric conversion section
15: Charge recombination layer
16: Second photoelectric conversion section
17: Hole transport layer
18: Electron transport layer

What is claimed is:

1. A tandem-type organic photoelectric conversion element comprising at least a first electrode, a second electrode and a plurality of bulk hetero junction layers each containing an n-type semiconductor material and a p-type semiconductor material, wherein, the plurality of bulk hetero junction layers contains a first bulk hetero junction layer and a second bulk hetero junction layer, provided, that the second bulk hetero junction layer absorbs a light of longer wavelength than the first bulk hetero junction layer, and that a LUMO level in a film state of the n-type semiconductor material of the first bulk hetero junction layer (LUMO(n1)) and a LUMO level in a film state of the n-type semiconductor material of the second bulk hetero junction layer (LUMO(n2)) satisfy Expression (1):

$0.4\ eV \geq LUMO(n1) - LUMO(n2) \geq 0.1\ eV$,  Expression (1)

wherein, the n-type semiconductor material contained in the first bulk hetero junction layer and the second bulk hetero junction layer is a compound having fullerene C60 as a parent fullerene compound, wherein the LUMP level in a film state of the n-type semiconductor material of the first bulk hetero junction layer (LUMO(n1)) satisfies Expression (3):

$-4.0\ eV \geq LUMO(n1) \geq -4.2\ eV$,  Expression (3)

and wherein the n-type semiconductor material contained in the second bulk hetero junction layer has a band gap of 1.5 to 1.0 eV.

2. The tandem-type organic photoelectric conversion element described in claim 1, wherein all of the plurality of bulk hetero junction layers are formed with a coating method.

3. The tandem-type organic photoelectric conversion element described in claim 2, wherein the n-type semiconductor material of the second bulk hetero junction layer is a compound represented by Formula (1):

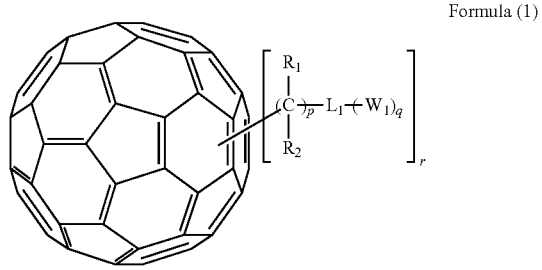

Formula (1)

wherein, $W_1$ represents an electron withdrawing group; and $L_1$ represents a single bond or a divalent linking group of a conjugated system selected from the group consisting of an alkenylene group, an alkynylene group, an arylene group and a arylene group; $R_1$ and $R_2$ each represent a monovalent substituent, provided that $R_1$ or $R_2$ may be bonded to fullerene with a single bond; p represents an integer of 0 or 1; and p and r each represent an integer of 1 to 5.

4. The tandem-type organic photoelectric conversion element described in claim 3, wherein $W_1$ in Formula (1) represents a fluoroalkyl group.

5. The tandem-type organic photoelectric conversion element described in claim 3, wherein the compound represented by Formula (1) is further represented by Formula (2):

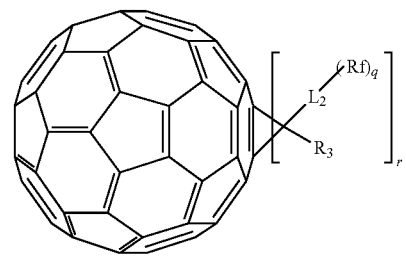

Formula (2)

wherein, Rf represents a fluoroalkyl group of 1 to 20 carbon atoms or a fluoroaryl group; $L_2$ represents a single bond or a divalent linking group of a conjugated system selected from the group consisting of an alkenylene group, an alkynylene group, an arylene group and a hetero arylene group; $R_3$ represents a monovalent substituent; and q and r each represent an integer of 1 to 5.

6. The tandem-type organic photoelectric conversion element described in claim 5, wherein $L_2$ in Formula (2) represents a nitrogen containing hetero arylene group.

7. The tandem-type organic photoelectric conversion element described in claim 1, wherein the LUMP level in a film state of the n-type semiconductor material of the second bulk hetero junction layer (LUMO(n2)) satisfies Expression (2):

$-4.4\ eV \geq LUMO(n2) \geq -4.6\ eV$.  Expression (2)

8. The tandem-type organic photoelectric conversion element described in claim 1, wherein the LUMO level in a film state of the n-type semiconductor material of the first bulk hetero junction layer (LUMO(n1)) and the LUMO level in a film state of the n-type semiconductor material of the second bulk hetero junction layer (LUMO(n2)) satisfy Expression (4):

$0.3\ eV \geq LUMO(n1) - LUMO(n2) \geq 0.2\ eV$.  Expression (4)

9. The tandem-type organic photoelectric conversion element described in claim 1, wherein the p-type semiconductor material contained in at least one of the first and second bulk hetero junction layers is a compound having a partial structure represented by Formula (3)

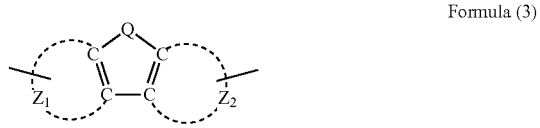

Formula (3)

wherein Q represents one selected from the group consisting of a substituted or unsubstituted carbon, nitrogen, oxygen, silicon, phosphor, sulfur and germanium atom; $Z_1$ represents a substituted or unsubstituted 6-membered nitrogen containing aromatic heterocycle; and $Z_2$ represents a substituted unsubstituted 6-membered aromatic hydrocarbon group or a substituted or unsubstituted 6-membered aromatic heterocycle.

10. The tandem-type organic photoelectric conversion element described in claim 9, wherein Q in Formula (3) which represents the partial structure of the compound is a substituted or unsubstituted nitrogen atom.

11. The tandem-type organic photoelectric conversion element described in claim 9,
wherein the p-type semiconductor material is a compound having a partial structure represented by Formula (4):

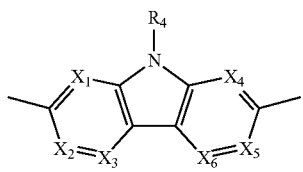

Formula (4)

wherein, $X_1$ to $X_6$ each represent a substituted or unsubstituted carbon or nitrogen atom, provided that at least one of $X_1$ to $X_6$ represents a nitrogen atom; $R_4$ represents a hydrogen atom, a halogen atom or a substituent selected from the group consisting of a substituted or unsubstituted alkyl, cycloalkyl, aryl and hetero aryl group.

12. The tandem-type organic photoelectric conversion element described in claim 11,
wherein $X_2$ and $X_5$ in Formula (5) which represents the partial structure of the compound is a nitrogen atom.

13. A solar cell comprising the tandem-type organic photoelectric conversion element described in claim 1.

14. The tandem-type organic photoelectric conversion element described in claim 1, wherein the first bulk hetero junction layer absorbs light in range of 380 to 750 nm and the second bulk hetero junction layer absorbs light in range of 800 to 1200 nm.

* * * * *